(12) United States Patent
Van Bilsen et al.

(10) Patent No.: US 8,139,217 B2
(45) Date of Patent: *Mar. 20, 2012

(54) ALIGNMENT SYSTEMS AND METHODS FOR LITHOGRAPHIC SYSTEMS

(75) Inventors: Franciscus Bernardus Maria Van Bilsen, Eindhoven (NL); Jacobus Burghoorn, Haelen (NL); Richard Johannes Franciscus Van Haren, Veldhoven (NL); Paul Christiaan Hinnen, Veldhoven (NL); Hermanus Gerardus Van Horssen, Maasbracht (NL); Jeroen Huijbregtse, Breda (NL); Andre Bernardus Jeunink, Bergeyk (NL); Henry Megens, Eindhoven (NL); Ramon Navarro Y Koren, Veldhoven (NL); Hoite Pieter Theodoor Tolsma, Eindhoven (NL); Hubertus Johannes Gertrudus Simons, Venlo (NL); Johny Rutger Schuurhuis, Eindhoven (NL); Sicco Ian Schets, Eindhoven (NL); Brian Young Bok Lee, Seoul (KR); Allan Reuben Dunbar, London (GB)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 12/977,541

(22) Filed: Dec. 23, 2010

(65) Prior Publication Data
US 2011/0128520 A1    Jun. 2, 2011

Related U.S. Application Data

(60) Continuation of application No. 11/294,367, filed on Dec. 6, 2005, now Pat. No. 7,880,880, which is a division of application No. 10/665,404, filed on Sep. 22, 2003, now Pat. No. 7,332,732.

(60) Provisional application No. 60/411,861, filed on Sep. 20, 2002, provisional application No. 60/413,601, filed on Sep. 26, 2002.

(30) Foreign Application Priority Data

Apr. 1, 2003 (EP) .................................. 03075954
May 12, 2003 (EP) .................................. 03076422

(51) Int. Cl.
*G01B 11/00*        (2006.01)
(52) U.S. Cl. .......................... 356/399; 356/400; 356/401
(58) Field of Classification Search .................... None
See application file for complete search history.

(56) References Cited

U.S. PATENT DOCUMENTS
4,037,969 A    7/1977    Feldman et al.
(Continued)

FOREIGN PATENT DOCUMENTS
DE            262510        11/1988
(Continued)

OTHER PUBLICATIONS

Markle D. A. "Submicron 1:1 Optical Lithography" Semi-conductor International pp. 173-142 May 1986.

(Continued)

*Primary Examiner* — Tarifur Chowdhury
*Assistant Examiner* — Gordon Stock, Jr.
(74) *Attorney, Agent, or Firm* — Pillsbury Winthrop Shaw Pittman LLP

(57) ABSTRACT

An alignment system for a lithographic apparatus has a source of alignment radiation; a detection system that has a first detector channel and a second detector channel; and a position determining unit in communication with the detection system. The position determining unit is constructed to process information from said first and second detector channels in a combination to determine a position of an alignment mark on a work piece, the combination taking into account a manufacturing process of the work piece. A lithographic apparatus has the above mentioned alignment system. Methods of alignment and manufacturing devices with a lithographic apparatus use the above alignment system and lithographic apparatus, respectively.

18 Claims, 20 Drawing Sheets

U.S. PATENT DOCUMENTS

| | | |
|---|---|---|
| 4,200,395 A | 4/1980 | Smith et al. |
| 4,251,160 A | 2/1981 | Bouwhuis et al. |
| 4,326,805 A | 4/1982 | Feldman et al. |
| 4,332,473 A | 6/1982 | Ono |
| 4,355,892 A | 10/1982 | Mayer et al. |
| 4,356,392 A | 10/1982 | Wittekoek et al. |
| 4,398,824 A | 8/1983 | Feldman et al. |
| 4,408,884 A | 10/1983 | Kleinknecht et al. |
| 4,514,858 A | 4/1985 | Novak |
| 4,540,277 A | 9/1985 | Mayer et al. |
| 4,596,467 A | 6/1986 | Bartlet |
| 4,614,432 A | 9/1986 | Kuniyoshi et al. |
| 4,690,529 A | 9/1987 | Sugiyama et al. |
| 4,704,033 A | 11/1987 | Fay et al. |
| 4,710,026 A | 12/1987 | Magome et al. |
| 4,737,283 A | 4/1988 | Gresch |
| 4,748,333 A | 5/1988 | Mizutani et al. |
| 4,757,207 A | 7/1988 | Chappelow et al. |
| 4,778,275 A | 10/1988 | Van Den Brink et al. |
| 4,814,829 A | 3/1989 | Kosugi et al. |
| 4,828,392 A | 5/1989 | Nomura et al. |
| 4,857,744 A | 8/1989 | Kataoka et al. |
| 4,861,162 A | 8/1989 | Ina |
| 4,870,452 A | 9/1989 | Tanimoto et al. |
| 4,902,133 A | 2/1990 | Tojo et al. |
| 4,952,970 A | 8/1990 | Suzuki et al. |
| 5,047,651 A | 9/1991 | Wessner et al. |
| 5,100,237 A | 3/1992 | Wittekoek et al. |
| 5,114,236 A | 5/1992 | Matsugu et al. |
| 5,118,953 A | 6/1992 | Ota et al. |
| 5,144,363 A | 9/1992 | Wittekoek et al. |
| 5,151,754 A | 9/1992 | Ishibashi et al. |
| 5,160,849 A | 11/1992 | Ota et al. |
| 5,229,872 A | 7/1993 | Mumola |
| 5,243,195 A | 9/1993 | Nishi |
| 5,296,891 A | 3/1994 | Vogt et al. |
| 5,347,356 A | 9/1994 | Ota et al. |
| 5,381,210 A | 1/1995 | Hagiwara et al. |
| 5,418,613 A | 5/1995 | Matsutani |
| 5,424,548 A | 6/1995 | Puisto |
| 5,446,587 A | 8/1995 | Kang et al. |
| 5,477,057 A | 12/1995 | Angeley et al. |
| 5,488,230 A | 1/1996 | Mizutani et al. |
| 5,489,986 A | 2/1996 | Magome et al. |
| 5,523,193 A | 6/1996 | Nelson |
| 5,543,921 A | 8/1996 | Uzawa et al. |
| 5,559,601 A | 9/1996 | Gallatin et al. |
| 5,596,204 A | 1/1997 | Irie et al. |
| 5,674,650 A | 10/1997 | Dirksen et al. |
| 5,721,607 A | 2/1998 | Ota |
| 5,801,390 A | 9/1998 | Shiraishi |
| 5,808,910 A | 9/1998 | Irie et al. |
| 5,910,847 A | 6/1999 | Van der Werf et al. |
| 5,917,604 A | 6/1999 | Dirksen et al. |
| 5,920,376 A | 7/1999 | Bruckstein et al. |
| 5,920,378 A | 7/1999 | Murakami et al. |
| 5,933,744 A | 8/1999 | Chen et al. |
| 5,969,441 A | 10/1999 | Loopstra et al. |
| 5,969,800 A | 10/1999 | Makinouchi |
| 5,995,198 A | 11/1999 | Mizutani |
| 6,023,338 A | 2/2000 | Bareket |
| 6,034,378 A | 3/2000 | Shiraishi |
| 6,046,792 A | 4/2000 | Van Der Werf et al. |
| 6,087,733 A | 7/2000 | Maxim et al. |
| 6,133,641 A | 10/2000 | Hamada et al. |
| 6,160,622 A | 12/2000 | Dirksen et al. |
| 6,233,494 B1 | 5/2001 | Aoyagi |
| 6,239,031 B1 | 5/2001 | Kepler et al. |
| 6,242,754 B1 | 6/2001 | Shiraishi et al. |
| 6,262,796 B1 | 7/2001 | Loopstra |
| 6,271,919 B1 | 8/2001 | Matsuura |
| 6,285,455 B1 | 9/2001 | Shiraishi |
| 6,297,876 B1 | 10/2001 | Bornebroek |
| 6,384,899 B1 | 5/2002 | Den Boef |
| 6,417,922 B1 * | 7/2002 | Dirksen et al. ................ 356/401 |
| 6,420,791 B1 | 7/2002 | Huang et al. |
| 6,462,818 B1 | 10/2002 | Bareket |
| 6,532,056 B2 | 3/2003 | Osakabe et al. |
| 6,542,243 B2 | 4/2003 | Kramer |
| 6,657,736 B1 | 12/2003 | Finarov et al. |
| 6,762,111 B2 | 7/2004 | Fukada |
| 6,777,139 B2 | 8/2004 | Baselmans |
| 6,819,426 B2 | 11/2004 | Sezginer et al. |
| 6,844,918 B2 | 1/2005 | Koren et al. |
| 6,858,948 B2 | 2/2005 | Van Haren |
| 6,864,956 B1 | 3/2005 | Teong et al. |
| 6,879,868 B2 | 4/2005 | Mos et al. |
| 6,888,261 B2 | 5/2005 | Song et al. |
| 6,937,344 B2 | 8/2005 | Monshouwer et al. |
| 6,985,618 B2 | 1/2006 | Adel et al. |
| 7,061,615 B1 | 6/2006 | Lowe-Webb |
| 7,099,010 B2 | 8/2006 | Schulz |
| 7,109,508 B2 | 9/2006 | Shiraishi |
| 7,112,813 B2 | 9/2006 | Den Boef et al. |
| 7,297,971 B2 | 11/2007 | Van Bilsen et al. |
| 7,329,888 B2 * | 2/2008 | Van Bilsen et al. ........... 250/548 |
| 2001/0026368 A1 | 10/2001 | Mikami |
| 2002/0021434 A1 | 2/2002 | Nomura et al. |
| 2002/0041373 A1 | 4/2002 | Littau et al. |
| 2002/0072003 A1 | 6/2002 | Brill et al. |
| 2002/0080364 A1 | 6/2002 | Monshouwer et al. |
| 2002/0080365 A1 | 6/2002 | Monshouwer et al. |
| 2002/0158193 A1 | 10/2002 | Sezginer et al. |
| 2003/0002043 A1 | 1/2003 | Abdulhalim et al. |
| 2003/0160163 A1 | 8/2003 | Wong et al. |
| 2004/0070741 A1 | 4/2004 | Osakabe et al. |
| 2004/0114143 A1 | 6/2004 | Van Haren et al. |
| 2005/0189502 A1 | 9/2005 | Van Bilsen et al. |
| 2006/0081791 A1 | 4/2006 | Van Bilsen et al. |
| 2007/0176128 A1 | 8/2007 | Van Bilsen et al. |

FOREIGN PATENT DOCUMENTS

| | | |
|---|---|---|
| EP | 0 467 445 B1 | 1/1999 |
| EP | 1256849 | 11/2002 |
| JP | 61-208220 | 9/1986 |
| JP | 64-14918 | 1/1989 |
| JP | 3-257303 | 11/1991 |
| JP | 6-224104 | 12/1994 |
| JP | 8-213300 | 8/1996 |
| JP | 8-306602 | 11/1996 |
| JP | 11-329914 | 11/1999 |
| JP | 2000-511004 | 8/2000 |
| JP | 2001-267211 | 9/2001 |
| WO | WO 98/33096 | 7/1998 |
| WO | WO 98/38597 A2 | 9/1998 |
| WO | WO 98/38597 A3 | 9/1998 |
| WO | 01-60543 | 6/2001 |
| WO | 02/019415 | 7/2002 |
| WO | 02/052350 A1 | 7/2002 |
| WO | WO 02/065545 A2 | 8/2002 |

OTHER PUBLICATIONS

Office Action for Taiwan Patent Application No. 092125977 dated May 31, 2005.

Rivera et al. Overlay Performance on Tungsten CMP Layers Using the ATHENA Alignment System Proc. of SPIE vol. 3998 Metrology Inspection and Process Control for Microlithography XIV ed. N. Sullivan (Mar. 2000) pp. 428-440.

Australian Patent Office Search Report for application No. SG 200305606-6 mailing date of Jun. 1, 2005.

Ramon Navarro, et al., "Extended ATHENA™ alignment performance and application for the 100 nm technology node", Metrology, Inspection, and Process for Microlithography XV, Proceedings of SPIE, vol. 4344 (2001).

P. Hinnen et al.: "Advances in Process Overlay" Proceedings of the SPIE, vol. 4344, Feb. 2001, pp. 114-126.

J. Huijbregtse et al: "Overlay Performance with Advanced ATHENA Alignment Strategies" Proceedings of the SPIE,, vol. 5038, Jan. 2003, pp. 918-928.

English Translation of Japanese Official Action issued on Mar. 4, 2009 in Japanese Application No. 2008-119913.

S. Warrick et al.: "Integration of New Alignment Mark Designs in Dual Inlaid Copper Interconnect Processes" Proceedings of the SPIE, vol. 4691, Jul. 2002, pp. 971-980.

J. Neijzen et al., "Improved Wafer Stepper Alignment Performance Using an Enhanced Phase Grating Alignment System" Proceedings of the SPIE, vol. 3677, 1999, pp. 382-394.

K. Prasad et al., "W-CMP Alignment Using ASML's ATHENA System on an I-line Stepper" Proceedings of SPIE, vol. 4344, Feb. 2001, pp. 79-88.

European Search Report issued on Feb. 25, 2009 in European Application No. 03077976.3.

European Search Report issued on Mar. 13, 2009 in European Application No. 03077974.8.

\* cited by examiner

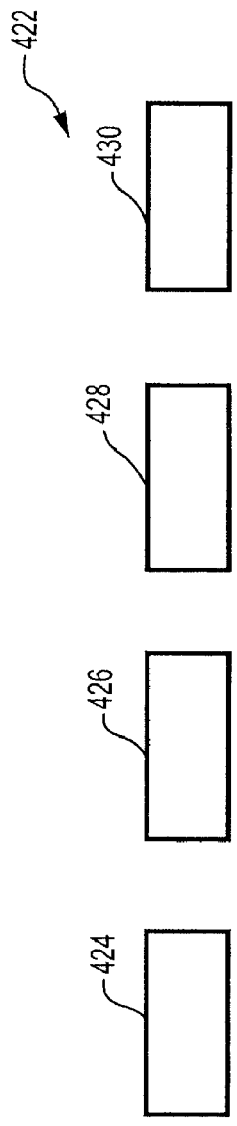
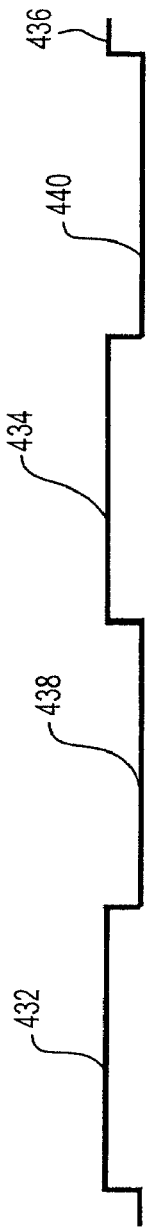
FIG. 22
FIG. 23A
FIG. 23B
FIG. 23C
FIG. 23D

ALIGNMENT SYSTEMS AND METHODS FOR LITHOGRAPHIC SYSTEMS

CROSS REFERENCE TO RELATED APPLICATIONS

This application is a continuation of U.S. application Ser. No. 11/294,367, filed Dec. 6, 2005, now U.S. Pat. No. 7,880,880, which is a divisional of U.S. application Ser. No. 10/665,404, filed Sep. 22, 2003, now U.S. Pat. No. 7,332,732, which claims priority to U.S. Provisional Application No. 60/411,861, filed Sep. 20, 2002, U.S. Provisional Application No. 60/413,601, filed Sep. 26, 2002, European Application No. 03075954.2, filed Apr. 1, 2003 and European Application No. 03076422.9, filed May 12, 2003. The entire contents of these applications are incorporated herein by reference.

BACKGROUND OF THE INVENTION

1. Field of Invention

This invention relates to an alignment system for a lithographic projection apparatus, and a lithographic projection apparatus having such an alignment system, and more particularly to an alignment system that can detect the position of an alignment mark using at least two separate signals detected substantially in parallel and/or detect the position of a multi-target mark.

2. Discussion of Related Art

Lithographic projection apparatuses are essential components for the manufacture of integrated circuits and/or other microdevices. With the aid of such an apparatus, a number of masks having different mask patterns are successively imaged at a precisely aligned position onto a substrate such as a semiconductor wafer or an LCD panel. The substrate must undergo the desired physical and chemical changes between the successive images that have been aligned with each other. The substrate is removed from the apparatus after it has been exposed with a mask pattern, and, after it has undergone the desired process steps, the substrate is replaced in order to expose it with an image of a second mask pattern, and so forth, while it must be ensured that the images of the second mask pattern and the subsequent mask patterns are positioned accurately with respect to the substrate. To this end, the lithographic projection apparatus is provided with an optical alignment system with which alignment marks on the substrate are aligned with respect to alignment marks on the mask.

A lithographic apparatus may not only be used for the manufacture of ICs but also for the manufacture of other structures having detailed dimensions of the order of 1 micrometer, or smaller. Examples are structures of integrated, or plenary, optical systems or guiding and detection patterns of magnetic domain memories, micro-electromechanical systems (MEMS), and structures of liquid crystal display panels. Also in the manufacture of these structures, images of mask patterns must be aligned very accurately with respect to a substrate.

The lithographic projection apparatus may be a stepping apparatus or a step-and-scan apparatus. In a stepping apparatus, the mask pattern is imaged in one shot on an IC area of the substrate. Subsequently, the substrate is moved with respect to the mask in such a way that a subsequent IC area will be situated under the mask pattern and the projection lens system and the mask pattern is imaged on the subsequent IC area. This process is repeated until all IC areas of the substrate are provided with a mask pattern image. In a step-and-scan apparatus, the above-mentioned stepping procedure is also followed, but the mask pattern is not imaged in one shot, but via scanning movement. During imaging of the mask pattern, the substrate is moved synchronously with the mask with respect to the projection system and the projection beam, taking the magnification of the projection system into account. A series of juxtaposed partial images of consecutively exposed parts of the mask pattern is imaged in an IC area. After the mask pattern has been completely imaged in an IC area, a step is made to a subsequent IC area. A possible scanning procedure is described in the article: "Sub-micron 1:1 Optical Lithography" by D. A. Markle in the magazine "Semiconductors International" of May 1986, pp. 137-142.

U.S. Pat. No. 5,243,195 discloses an optical lithographic projection apparatus provided with an alignment system and intended for the manufacture of ICs. This alignment system comprises an off-axis alignment unit for aligning a substrate alignment mark with respect to this alignment unit. In addition, this alignment system comprises a second alignment unit for aligning a substrate mark with respect to a mask mark via the projection lens (TTL). Alignment via the projection lens (on-axis alignment) is frequently used in many current generation of optical lithographic projection apparatuses and provides the advantage that the substrate and the mask can be aligned directly with respect to each other. When the off-axis alignment method is used, the baseline offset as described in U.S. Pat. No. 5,243,195 must be taken into account. However, with the continued decrease in the size of components on ICs and the increase in complexity, on-axis alignment systems have proven to be difficult to improve sufficiently to achieve the require precision and accuracy.

In connection with the increasing number of electronic components per unit of surface area of the substrate and the resultant smaller dimensions of these components, increasingly stricter requirements are imposed on the accuracy with which integrated circuits are made. The positions where the successive masks are imaged on the substrate must therefore be fixed more and more accurately. In the manufacture of new-generation ICs with smaller line widths, the alignment accuracy will have to be improved or, in other words, it must be possible to detect smaller deviations so that the resolving power of the alignment system must be increased. On the other hand, stricter requirements must also be imposed on the flatness of the substrate due to the required higher numerical aperture (NA) of the projection lens system in the case of decreasing line widths. The depth of focus of this system decreases as the NA increases. Since some image field curvature occurs at the desired relatively large image field of the projection lens system, there is hardly any room left for unevenness of the substrate. To obtain the desired flatness of the substrate, it has been proposed to polish the substrate by the chemical mechanical polishing (CMP) process between two consecutive exposures with different mask patterns in the projection apparatus. However, this polishing process affects the accuracy of the on-axis alignment method. In this method, a grating is used as a substrate alignment mark and the sub-beams diffracted in the first order by this grating are used for imaging the substrate mark on the reticle mark. In this process, it is assumed that the substrate is aligned correctly with respect to the reticle when the point of gravity of the substrate grating mark is aligned with respect to the point of gravity of the reticle alignment mark. In that case it has been assumed that the point of gravity for each grating mark coincides with the geometrical center of the grating. However, the CMP process renders the substrate grating mark asymmetrical so that this alignment method is no longer reliable. In addition, the various processing steps contribute to changes in the alignment marks including introducing asymmetries and changes in the effective depth of the grooves of the substrate grating marks. Other processing steps and/or methods often introduce different types of errors. For example, the Cu-damascene process tends to introduce alignment errors in a random distribution across an IC surface. With the decrease in size and increase in complexity of structures built by lithographic techniques there is a continued demand to improve alignment accuracy. Without the improvement of alignment accuracy, improvements in resolution cannot be utilized. In addition, the increased complexity of the micro-devices places greater demand for techniques to control and minimize the number of substrates that have to be discarded during the manufacturing process due to alignment errors.

SUMMARY

It is thus an object of the present invention to provide an alignment system for a lithographic projection apparatus that has improved alignment accuracy and/or robustness.

In order to achieve these and other objectives of this invention an alignment system for a lithographic apparatus is provided with a source of alignment radiation; a detection system comprising a first detector channel and a second detector channel; and a position determining unit in communication with said detection system. The position determining unit processes information from the first and second detector channels in combination to determine a position of an alignment mark on a first object relative to a reference position on a second object based on the combined information.

According to another embodiment of this invention, a lithographic projection apparatus has a source of illumination radiation; a substrate stage assembly arranged in a radiation path of the source of illumination radiation; a reticle stage assembly arranged in the radiation path of the source of illumination radiation between the source and the substrate stage assembly; a projection system arranged between the reticle stage assembly and the substrate stage assembly; and an off-axial alignment system arranged adjacent to the projection system and proximate the substrate stage assembly. The off-axial alignment system has a source of alignment radiation; a detection system comprising a first detector channel and a second detector channel; and a position determining unit in communication with the detection system. The position determining unit processes information from the first and second detector channels in combination to determine a position of an alignment mark on a first object relative to a reference position on a second object based on the combined information. The alignment system may be located away from said radiation path of illumination radiation. All that is required is that alignment radiation from the alignment system is able to reach the substrate stage assembly.

According to another embodiment of this invention, a method of aligning a workpiece for the manufacture of a microdevice includes forming a multi-target alignment mark on the workpiece; scanning the multi-target alignment mark with an alignment system having a plurality of detectors, wherein a first target of the multi-target alignment mark is adapted to be detected by a first detector of the plurality of detectors of the alignment system, and a second target of the multi-target alignment mark is adapted to be detected from a second detector of the plurality of detectors of the alignment system; receiving a first signal from the first detector of the alignment system in response to the first target of the multi-target alignment mark; receiving a second signal from the second detector of the alignment system in response to the second target of the multi-target alignment mark; and determining a position of the alignment mark on the workpiece relative to a predetermined reference position based on information from the first and second signals.

According to another embodiment of this invention a method of capturing an alignment mark on a workpiece for the manufacture of a microdevice within a measurement region includes forming a multi-grating alignment mark on the workpiece; scanning the multi-grating alignment mark with an alignment system having a plurality of detectors; selecting first and second gratings from said multi-grating alignment mark; comparing a first substantially periodic signal from the first grating of the multi-grating alignment mark from a first one of the plurality of detectors to a second substantially periodic signal from the second grating of the multi-grating alignment mark from a second one of the plurality of detectors; and determining a capture range based on the comparing. The first grating can be a diffraction-order-enhancing grating that enhances an order greater than first order and the second grating can be a diffraction-order-enhancing grating that enhances an order greater than first order.

According to another embodiment of this invention, an alignment mark for use in the manufacture of a micro-device has a first target that has a first detection pattern; and a second target that has a second detection pattern. The first target is adapted to be detected by a first detector and the second target is adapted to be detected by a second detector.

According to another embodiment of this invention, a diffraction-order-enhancing alignment mark for use in the manufacture of a micro-device has a diffraction grating pattern that has a periodic pattern and a sub-pattern. The diffraction-order-enhancing grating enhances a strength of a diffracted beam of non-zero order.

According to another embodiment of this invention, an alignment mark for use in the manufacture of a microdevice has a target that has a detection pattern and a processing pattern. The processing pattern has a structure that changes under micro-device processing in correspondence with changes to said micro-device during manufacture.

BRIEF DESCRIPTION OF THE DRAWINGS

FIG. 22 is a schematic illustration of a four-target alignment mark, suitable for forming in scribe lines of semiconductor wafers, according to an embodiment of this invention;

FIGS. 23A-23D are schematic, cross sectional views of portions of diffraction-order enhancing gratings suitable for targets in alignment marks according to embodiments of this invention;

DETAILED DESCRIPTION

Methods and devices according to this invention will now be described with reference to particular embodiments by way of example. The broad concepts of this invention are not limited to only these specifically described embodiments. The invention will be described with reference to an alignment system for a photolithography system that includes both an on-axis (also referred to as "axial") and an off-axis ("off-axial") alignment system that can be used in combination to obtain the eventual alignment of a mask with respect to a substrate ("workpiece"). The axial alignment system may have a separate source of radiation to illuminate alignment marks, such as in through-the-lens (TTL) or through-the-reticle (TTR) systems, or it may employ the same radiation as the exposure radiation. The following example will describe a TTL system in combination with an off-axial system (OAS) as an embodiment of this invention. Furthermore, the invention envisions application to photolithography systems that have refraction projection systems as well as to other types of lithography systems that use shorter wavelengths of electromagnetic radiation than currently employed, systems which use reflective and/or diffraction imaging optics, and/or systems which use other types of radiation such as charged-particle beams, e.g., electron beams that are imaged with magnetic, electromagnetic, and/or electrostatic imaging optics. Embodiments of this invention also envision integrating the alignment process of the lithography systems with other components of an Automated Process Control (APC) system such as a metrology tool that is used to measure the accuracy of an exposure of a photo-resist prior to further processing.

We now describe an optical lithographic projection apparatus that has an on-axis alignment unit and other measuring systems as an example of a system that may incorporate an embodiment of the instant invention.

Figure 1:
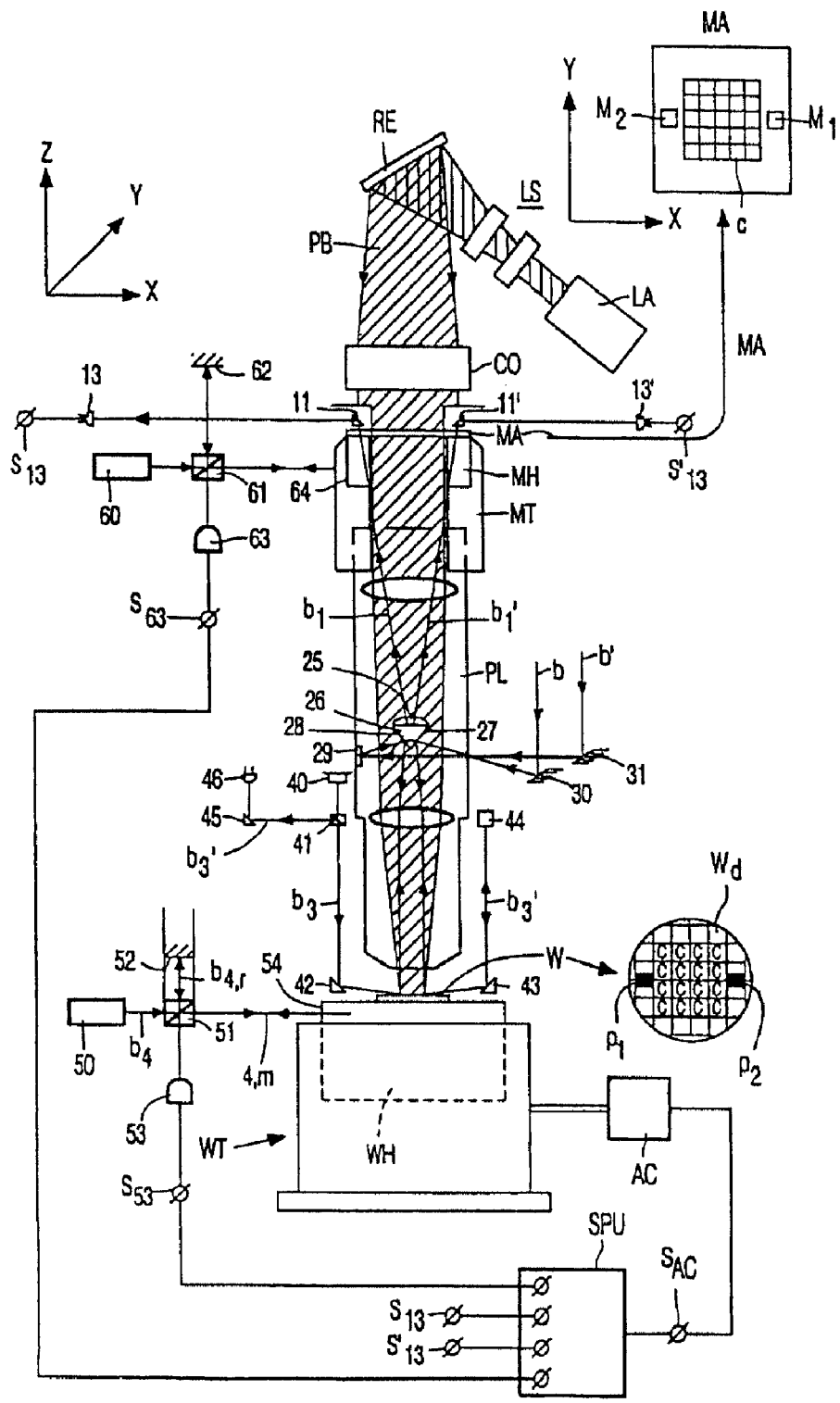
FIG. 1 shows an embodiment of a step-and-scan projection apparatus with the various measuring systems.

FIG. 1 shows diagrammatically the optical elements of an embodiment of such an apparatus for step-and-scan imaging a mask pattern on a substrate. This apparatus comprises, as its main component, a projection column incorporating a projection system PL. Situated above this system is a mask holder MH for a mask MA in which the mask pattern C to be imaged is provided. The mask holder is part of a mask stage MT. A substrate stage WT is arranged below the projection lens system PL. This table comprises a substrate holder WH for a substrate W provided with a photosensitive layer. The mask pattern C must be imaged a number of times in the photosensitive layer, every time in a different area, an IC area $W_d$. The substrate table is movable in the X and Y directions so that, after imaging the mask pattern in a first IC area, a subsequent IC area can be positioned under the mask pattern.

The apparatus further comprises an illumination system which is provided with a radiation source LA, for example a Krypton-Fluoride Excimer laser or a mercury lamp, a lens system LS, a mirror RE and a condenser lens CO. The projection beam PB supplied by the illumination system illuminates the mask pattern C. This pattern is imaged by the projection lens system PL on an IC area of the substrate W. The projection lens system has, for example, a magnification M=¼, a numerical aperture NA=0.6 and a diffraction-limited image field with a diameter of 22 mm.

The apparatus is further provided with a number of measuring systems, namely a system for aligning the mask MA and the substrate W with respect to each other in the XY plane, an interferometer system for determining the position and orientation of the substrate holder and hence of the substrate, and a focus error detection system for determining a difference between the focal or image plane of the projection lens system PL and the surface of the substrate W. These measuring systems are parts of servo systems which comprise electronic signal-processing and control circuits and drivers, or actuators, with which the position and orientation of the substrate and the focusing can be corrected with reference to the signals supplied by the measuring systems.

Figure 2:
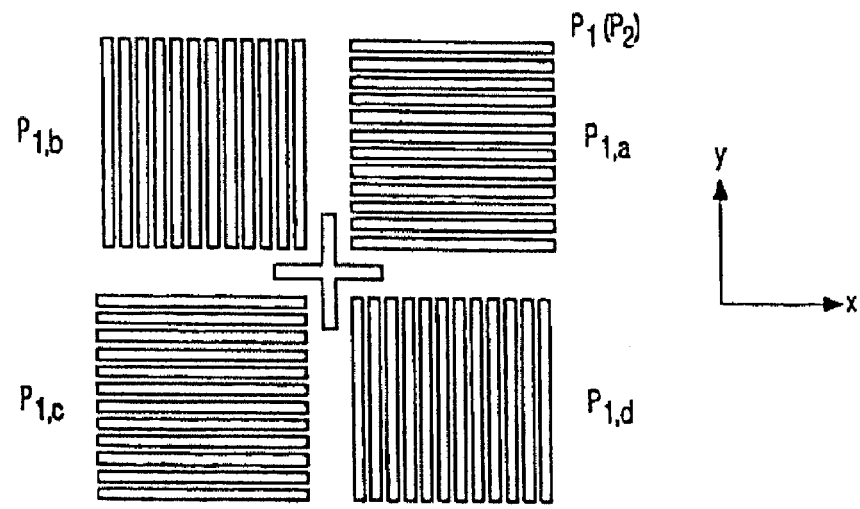
FIG. 2 shows an embodiment of a substrate alignment mark.

The alignment system makes use of two alignment marks $M_1$ and $M_2$ in the mask MA shown in the top right part of FIG. 1. As is shown in FIG. 2, these marks may be diffraction gratings, but may alternatively be other marks such as squares or strips which are optically distinguished from their surroundings. The alignment marks may be two-dimensional, i.e. they extend in two mutually perpendicular directions, the X and Y directions in FIG. 1, or may be used in conjunction with other marks to extend in both X and Y directions. The substrate W, for example a semiconductor substrate, has at least two alignment marks, which may be two-dimensional diffraction gratings, two of which, $P_1$ and $P_2$, are shown in FIG. 1. The marks $P_1$ and $P_2$ are situated outside the IC areas on the substrate W. The grating marks $P_1$ and $P_2$ are preferably implemented as phase gratings and the grating marks $M_1$ and $M_2$ are preferably implemented as amplitude gratings. Other types of alignment marks may be provided along scribe lines between adjacent circuits.

FIG. 1 shows a special embodiment of an on-axis alignment unit, namely a double alignment unit in which two alignment beams b and b' are used for aligning the substrate alignment mark $P_2$ on the mask alignment mark $M_2$, and for aligning the substrate alignment mark $P_1$ on the mask alignment mark $M_1$, respectively. The beam b is reflected by a reflecting element 30, for example a mirror, towards the reflecting surface 27 of a prism 26. The surface 27 reflects the beam b towards the substrate alignment mark $P_2$ which sends a part of the radiation as beam $b_1$ to the associated mask mark M where an image of the mark $P_2$ is formed. Situated above the mark $M_2$ is a reflecting element 11, for example a prism, which directs the radiation that passes by the mark $M_2$ towards a radiation-sensitive detector 13.

The second alignment beam b' is reflected by a mirror 31 towards a reflector 29 in the projection lens system PL. This reflector sends the beam b' to a second reflecting surface 28 of the prism 26, which surface directs the beam b' onto the substrate alignment mark $P_1$. This mark reflects a part of the radiation of the beams b' as beam $b'_1$ to the mask alignment mark $M_1$ where an image of the mark $P_1$ is formed. The radiation of the beam $b'_1$ passing through the mark $M_1$ is directed by a reflector 11' towards a radiation sensitive detector 13'.

FIG. 2 shows an embodiment of one of the two identical substrate marks, in the form of phase gratings, on a larger scale. Such a grating may consist of four subgratings $P_{1,a}$, $P_{1,b}$, $P_{1,c}$ and $P_{1,d}$, two of which, $P_{1,b}$ and $P_{1,d}$, serve for alignment in the X direction and the two other ones, $P_{1,a}$ and $P_{1,c}$ serve for alignment in the Y direction. The two sub-gratings $P_{1,b}$ and $P_{1,c}$ have a grating period of, for example 16 μm and the sub-gratings $P_{1,a}$ and $P_{1,d}$ have a grating period of, for example 17.6 μm. Each sub-grating may have a dimension of, for example 200×200 μm. An alignment accuracy which, in principle, is smaller than 0.1 μm can be achieved with this grating mark and a suitable optical system. By choosing different grating periods, the capture range of the alignment unit can be enlarged. This range is, for example 40 μm.

Figure 3:
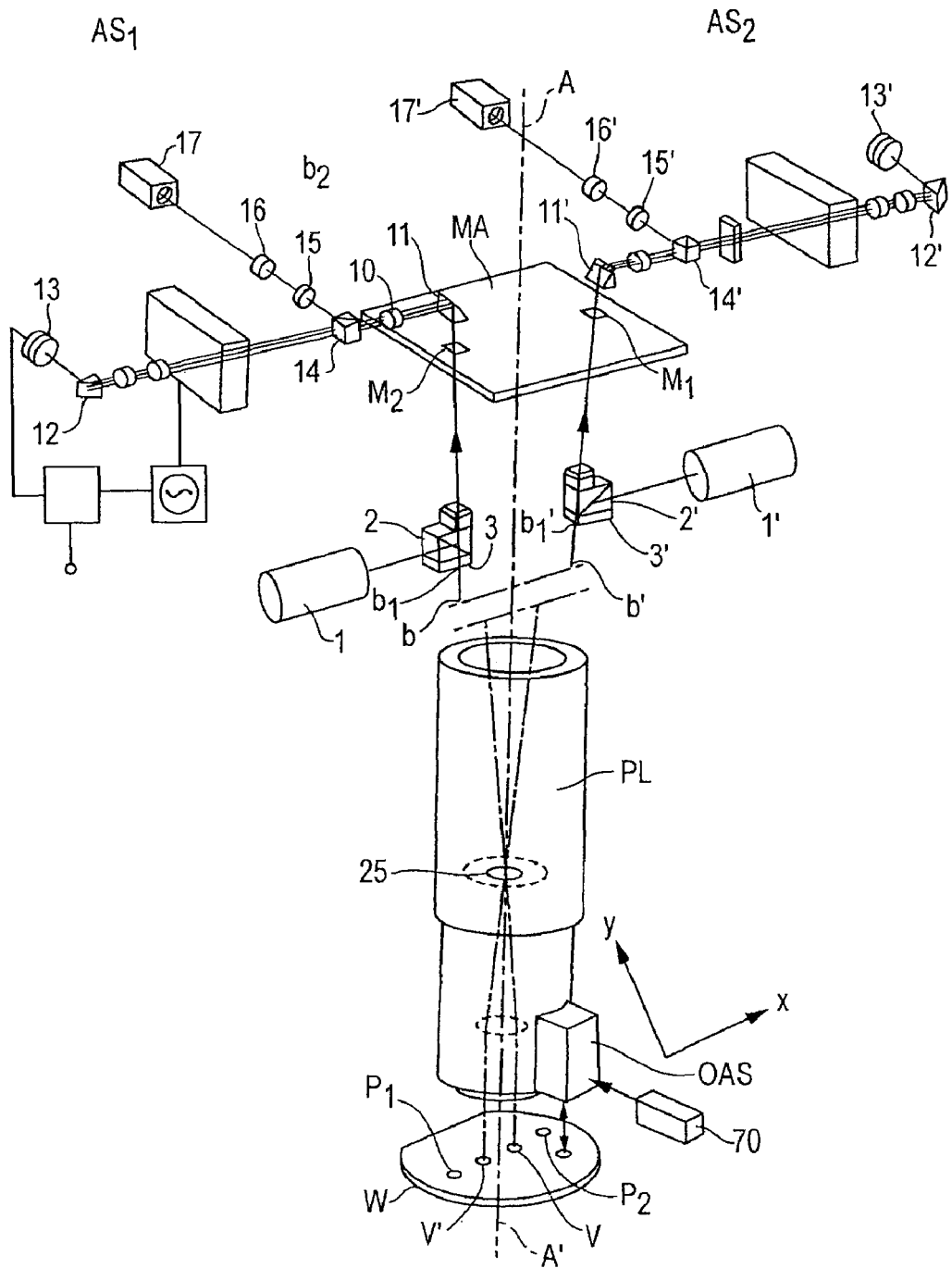
FIG. 3 shows an embodiment of a double alignment unit for aligning a mask mark and a substrate mark with respect to each other.

FIG. 3 shows the optical elements of a slightly modified alignment unit in greater detail. The double alignment unit comprises two separate and identical alignment systems $AS_1$ and $AS_2$ which are positioned symmetrically with respect to the optical axis AA' of the projection lens system PL. The alignment system $AS_1$ is associated with the mask alignment mark $M_2$ and the alignment system $AS_2$ is associated with the mask alignment mark $M_1$. The corresponding elements of the two alignment systems are denoted by the same reference numerals, those of the system $AS_2$ being primed so as to distinguish them from those of the system $AS_1$.

The structure of the system $AS_1$ will now be described, as well as the way in which the mutual position of the mask mark $M_2$ and, for example, the substrate mark $P_2$ is determined with this system.

The alignment system $AS_1$ comprises a radiation source 1, for example a Helium-Neon laser emitting an alignment beam b. This beam is reflected to the substrate W by a beam splitter 2. The beam splitter may consist of a semi-transparent mirror or a semitransparent prism but is preferably constituted by a polarization-sensitive splitting prism 2 preceding a λ/4 plate 3, in which λ is the wavelength of the beam b. The projection lens system PL focuses the beam b in a small radiation spot V, having a diameter of the order of 1 mm, on the substrate W. This substrate reflects a part of the beam as beam $b_1$ towards the mask MA. The beam $b_1$ traverses the projection lens system PL, which system images the radiation spot V on the mask. Before the substrate is arranged in the projection apparatus, it has been pre-aligned in a pre-alignment station coupled to the apparatus, for example the station described in EP Patent Application 0 164 165, such that the radiation spot V is located on the substrate mark $P_2$. This mark is then imaged on the mask mark $M_2$ by the beam $b_1$. With the magnification M of the projection lens system being taken into account, the dimension of the mask mark $M_2$ is adapted to that of the substrate mark $P_2$ so that the image of the mark $P_2$ coincides accurately with the mark $M_2$ when the two marks are mutually positioned correctly.

On its path to and from the substrate W, the beams b and $b_1$ have traversed the λ/4 plate 4 twice, whose optical axis is at an angle of 45° to the direction of polarization of the linearly polarized beam b coming from the source 1. The beam $b_1$ passing through the λ/4 plate then has a direction of polarization which is rotated 90° with respect to the beam b so that the beam $b_1$ is passed by the polarization splitting prism. The use of the polarization splitting prism in combination with the λ/4 plate provides the advantage of a minimal radiation loss when coupling the alignment beam into the radiation path of the alignment system.

The beam $b_1$ passed by the alignment mark $M_2$ is reflected by a prism 11 and directed, for example by a further reflecting prism 12 towards a radiation-sensitive detector 13. This detector is, for example a composite photodiode having, for example four separate radiation-sensitive areas in conformity with the number of sub-gratings shown in FIG. 2. The output signals of the detector areas are a measure of coincidence of the mark $M_2$ with the image of the substrate mark $P_2$. These signals can be processed electronically and used for moving the mask and the substrate with respect to each other by means of driving systems (not shown), such that the image of the mark P coincides with the mark M. An automatic alignment system is thus obtained.

A beam splitter 14 in the form of, for example a partially transparent prism splitting a portion of the beam $b_1$ as beam $b_2$ may be arranged between the prism 11 and the detector 13. The split beam is incident via, for example two lenses 15 and 16 on a television camera 17 which is coupled to a monitor (not shown) on which the alignment marks $P_2$ and $M_2$ are visible to an operator of the projection apparatus. This operator can then ascertain whether the two marks coincide and move the substrate W by means of manipulators so as to cause the marks to coincide.

Analogously as described hereinbefore for the marks $M_2$ and $P_2$, the marks $M_1$ and $P_2$ and the marks $M_1$ and $P_1$ can be aligned with respect to each other. The alignment system $AS_2$ is used for the last-mentioned two alignments.

For further particulars about the construction and the alignment procedure of the double alignment unit, reference is made to U.S. Pat. No. 4,778,275, which is incorporated herein by reference.

The embodiment of the on-axis alignment unit shown in FIG. 1 is particularly suitable for an apparatus in which a projection beam PB having a short wavelength, for example 248 nm, and an alignment beam having a considerably larger wavelength, for example 633 nm, are used.

Since the projection lens system is designed for the wavelength of the projection beam PB, differences occur when this system PL is used for imaging the alignment marks $P_1$, $P_2$ and $M_1$ and $M_2$ on each other by means of the alignment beam.

For example, the substrate alignment marks will not be situated in the plane of the mask pattern in which the mask alignment marks are situated, but will be imaged at a given distance therefrom, which distance depends on the difference between the wavelength of the projection beam and the alignment beam and the difference between the refractive indices of the material of the projection lens elements for the two wavelengths. If the projection beam has a wavelength of, for example 248 nm and the alignment beam has a wavelength of 633 nm, this distance may be 2 mm. Moreover, due to said wavelength difference, a substrate alignment mark is imaged on a mask alignment mark with a magnification which differs from the desired magnification and increases with an increasing wavelength difference.

To correct for said differences, the projection lens system PL incorporates an extra lens, a correction lens, 25. The correction lens is arranged at such a height in the projection lens that, on the one hand, in the plane of the correction lens the sub-beams of the different diffraction orders of the alignment beam, which sub-beams originate from, and are also generated by, a substrate alignment mark, are sufficiently separated to be able to influence these sub-beams separately and, on the other hand, this correction lens has a negligible influence on the projection beam and the mask pattern image formed with it. The correction lens is preferably situated in the Fourier plane of the projection lens system. If, as is shown in FIG. 3, the correction lens 25 is situated in a plane in which the chief rays of the alignment beams b and b' intersect each other, then this lens can be used for correcting both alignment beams.

If desired, a wedge or a different deflection element such as a diffraction element may be arranged in the path of the alignment beam(s) proximate to an alignment mark. With such a deflection element, not shown in FIG. 3, alignment errors resulting from unintentional phase differences within the selected alignment beam portions received by the detector 13 or 13' may be prevented, which phase differences may occur if the axis of symmetry of the alignment beam portions coming from a substrate alignment mark is not perpendicular to the mask plate, so that false reflections may occur within this plate. An alignment unit provided with such a deflection element is described in EP Patent Application 0 467 445.

In addition to the global alignment marks $P_1$ and $P_2$, shown in FIG. 1, which are used for aligning the entire substrate with respect to the mask, referred to as global alignment, the substrate may be provided with further alignment marks per IC area so as to align each IC area separately with respect to the mask pattern. The mask may also comprise more than two alignment marks in which the further alignment marks may be used, for example to measure the rotation of the mask about the Z axis so that this rotation can be corrected.

The projection apparatus further comprises a focus error detection system for determining a deviation between the focal plane of the projection lens system PL and the surface of the substrate W, so that this deviation can be corrected, for example by moving the projection lens system along its axis, the Z axis. This system may be constituted by the elements 40, 41, 42, 43, 44, 45 and 46 which are arranged in a holder (not shown) which is fixedly connected to the projection lens system. The reference numeral 40 denotes a radiation source, for example a diode laser, which emits a focusing beam $b_3$. This beam is directed at a small angle onto the substrate by a reflecting prism 42. The beam reflected by the substrate is directed towards a retroreflector 44 by the prism 43. The element 44 reflects the beam in itself so that the beam ($b_3'$) once again traverses the same path via reflections on the prism 43, the substrate W and the prism 42.

The beam $b_3'$ reaches a radiation-sensitive detection system 46 via a partially reflecting element 41 and a reflecting element 45. This detection system consists of for example a position-dependent detector, or of two separate detectors. The position of the radiation spot formed by the beam $b_3'$ on this system is dependent on the extent to which the focal plane of the projection lens system coincides with the plane of the substrate W. For an extensive description of the focus error detection system, reference is made to U.S. Pat. No. 4,356,392.

For accurately determining the X and Y positions of the substrate holder, a stepping projection apparatus is provided with a multi-axis interferometer system. U.S. Pat. No. 4,251,160 describes a system with two measuring axes and U.S. Pat. No. 4,737,283 describes a system with three measuring axes. In FIG. 1, such an interferometer system is diagrammatically shown by means of the elements 50, 51, 52 and 53, while only one measuring axis, the X axis, is shown. A beam $b_4$ emitted by a radiation source 50 in the form of a laser is split by a beam splitter 51 into a measuring beam $b_{4,m}$ and a reference beam $b_{4,r}$. The measuring beam reaches a reflecting side face 54 of the substrate holder WH and the reflected measuring beam is combined by the beam splitter 51 with the reference beam reflected by a stationary retroreflector, for example a corner cube. The intensity of the combined beam is measured with a detector 53, and the displacement, in this case in the X direction, of the substrate holder WH can be derived from the output signal of this detector, and also an instantaneous position of this holder can be determined.

As is diagrammatically shown in FIG. 1, the interferometer signals, represented for the sake of simplicity by one signal $S_{53}$, and the signals $S_{13}$ and $S'_{13}$ of the double alignment unit are applied to a signal-processing unit SPU, for example a microcomputer, which processes said signals to control signals $S_{AC}$ for an actuator AC with which the substrate holder is moved in the XY plane via the substrate table WT.

With an interferometer system, which has not only the X measuring axis shown in FIG. 1 but also a Y measuring axis and possibly a third measuring axis, the positions of, and the mutual distances between, the alignment marks $P_1$, $P_2$ and $M_1$, $M_2$ can be fixed in a system of coordinates defined by the stationary interferometer system during the initial, or global, alignment of the mask and the substrate with respect to each other. This interferometer system is also used for moving the substrate table very accurately, which is necessary for a stepping projection apparatus so as to be able to step very accurately from a first IC area to a second IC area.

If, as shown in FIG. 1, the projection apparatus is a step-and-scan apparatus, in which the mask and the substrate must be moved synchronously during the projection of the mask pattern in an IC area, the mask must also be moved in one direction, the scanning direction. With the magnification M of the projection lens system being taken into account, this movement must be synchronous with the corresponding movement of the substrate. Then, the mask and the substrate must stand still with respect to each other during projection and both must be moved with respect to the projection lens system and the projection beam. To measure the movement of the mask, the apparatus must be provided with a second interferometer system. This interferometer system comprises the elements 60, 61, 62, 63 and 64 which have a similar function as the elements 50, 51, 52, 53 and 54. The signals from the mask interferometer system, represented for the sake of simplicity by a signal S63 in FIG. 1, are applied to the signal-processing unit SPU in which these signals are compared with the corresponding signals from the substrate interferometer system. It can then be ascertained whether the mask and the substrate mutually have the correct position and/or move synchronously.

If the positions in the X and Y directions of the mask are represented by $X_r, Y_r$ and those of the substrate by $X_w, Y_w$ and the rotation about the Z axis by $\phi_{r,r}$ and $\phi_{z,w}$, then the following conditions are satisfied when the mask and the substrate are correctly positioned with respect to each other:

$$X_w = M \cdot X_r = 0 \quad (1)$$

$$Y_w - M \cdot Y_r = 0 \quad (2)$$

$$\Phi_{z,w} - \phi_{z,r} = 0 \quad (3)$$

in which M is the magnification of the projection lens system. It has been assumed that the mask and the substrate move in opposite directions. If these elements move in the same direction, the minus sign preceding M in the above conditions should be replaced by a plus sign.

To ascertain whether these conditions have been met, it is sufficient that both the interferometer system for the substrate and that for the mask have three measuring axes.

However, the substrate interferometer system preferably has five measuring axes. Then, not only $X_w, Y_w$ and $\phi_{z,w}$, but also $\phi_{x,w}$ and $\phi_{y,w}$, i.e. the tilts about the X axis and the Y axis can be measured.

To be able to measure such tilts of the mask, a five-axis mask interferometer system may be used, or a combination of a three-axis interferometer system for determining $X_r, Y_r$ and $\phi_{z,r}$ and other sensors such as capacitive sensors for the $\phi_{x,r}$ and $\phi_{y,r}$ measurements.

If $X_w, Y_w, \phi_{x,w}$, and $\phi_{y,w}$ and $X_r, Y_r, \phi_{z,r}, \phi_{x,r}, \phi_{y,r}$ and, with the aid of the focus error detection system, $Z_w$ and $Z_r$, i.e. the positions along the Z axis of the substrate and the mask can be measured, it can be ascertained whether not only the conditions (1), (2) and (3) are met, but also the conditions:

$$M^2 \cdot Z_w - Z_r = 0 \quad (4)$$

$$M \cdot \phi_{x,w} - \phi_{x,r} = 0 \quad (5)$$

$$M \cdot \phi_{y,w} - \phi_{y,r} = 0 \quad (6)$$

The on-axis alignment unit, described with reference to FIG. 3, for mutually aligning a mask alignment mark and a substrate alignment mark with respect to each other has been found to be eminently suitable for both stepping and step-and-scan projection apparatuses with which images having line widths up to a given minimal value are formed. However, it is expected that the use of novel technologies in the IC manufacture and decreasing line widths in the images will lead to problems as far as accuracy and reliability of the known alignment unit are concerned. When reducing the line width, the alignment accuracy must be enhanced. When using said CMP process, asymmetries are introduced in the substrate grating mark so that the alignment procedure in which the first-order sub-beams are used becomes unreliable. Moreover, when using an alignment beam having one wavelength, strict requirements must be imposed on the depth of the grating grooves of the alignment mark, which requirements can only be met with increasing difficulty.

All of these problems can be solved by making use of an off-axis alignment unit for aligning the substrate mark and by using higher-order sub-beams, i.e. sub-beams having a diffraction order which is higher than 1, in the alignment. Since the alignment of the substrate mark no longer takes place through the projection lens system, there will be greater freedom to use more sub-beams, particularly higher-order sub-beams. Since the resolving power of the alignment unit increases with an increasing order number of the sub-beams, the accuracy of the alignment can be enhanced considerably. Since notably the higher-order sub-beams are determined by the edges of the substrate grating mark and, as compared with the center of the grating, these edges are less influenced by said CMP process and other measures affecting the symmetry of the grating, the problem of asymmetry in the grating mark is largely eliminated. Moreover, it is also possible to use alignment radiation with more than one wavelength so that the requirements imposed on the depth of the grating grooves can be alleviated considerably.

As will be elucidated hereinafter, the diffraction orders are separated from each other by optical elements in the alignment unit according to the invention, not by electronic means and/or associated software. Consequently, it is not necessary to measure signal amplitudes but the phase measurements which are more conventional in these kinds of techniques can be used.

Figure 4:
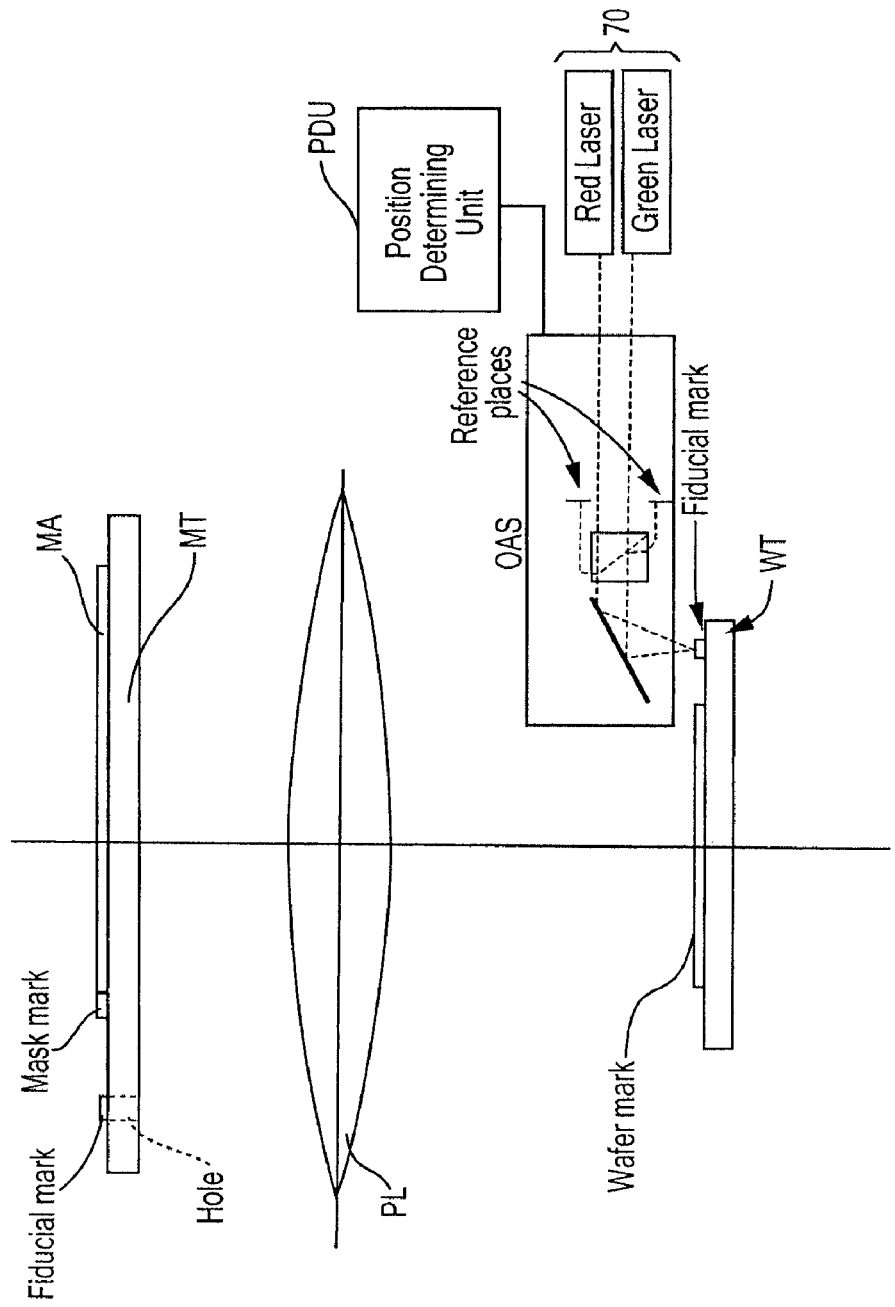
FIG. 4 is a schematic illustration of a lithographic apparatus that has an off-axial alignment system according to an embodiment of this invention.

FIG. 4 is a schematic illustration of a lithographic system that has an off-axis alignment system. The off-axis alignment system has two sources of radiation 70 for illuminating alignment marks at two different wavelengths, for example a red laser and a green laser. Both lasers illuminate an alignment mark simultaneously and reflected light is directed to separate detector channels (e.g., a red channel and a green channel). Signals in each of the two wavelength channels are thus obtained in parallel. In addition, several diffraction orders may be separately detected for each of the two wavelengths, thus providing a plurality of color/order channels outputting signals in parallel. A position determining unit PDU is in communication with the plurality of color/order channels of the detection system. The position determining unit PDU may be a hard-wired special purpose device performing particular functions or it may include a programmable computer that is programmed to perform the desired functions. In addition, it may be a separate unit from the SPU illustrated in FIG. 1 or it may be implemented through software in the SPU. The position determining unit PDU processes signals from at least two of the color/order channels to determine the position of the alignment mark being detected.

Figure 5:
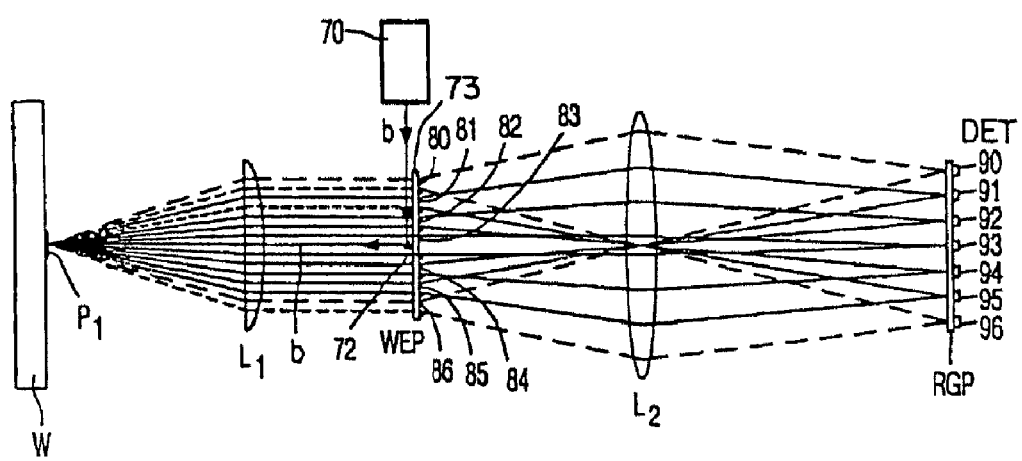
FIG. 5 shows an embodiment of an off-axis alignment unit according to the invention.

FIG. 5 is a schematic illustration of an off-axis alignment unit according to an embodiment of this invention. Many structural features of alignment systems described here are similar or the same as those described in U.S. Pat. No. 6,297,876, the entire content of which is incorporated herein by reference. The substrate mark, in the form of a grating, is denoted by $P_1$. A parallel alignment beam b having a wavelength; incident on this grating is split up into a number of sub-beams extending at different angles $\alpha_n$ (not shown) to the normal on the grating, which angles are defined by the known grating formula:

$$\operatorname{Sin} \alpha_n = \frac{N \cdot \lambda}{P} \quad (7)$$

wherein N is the diffraction order number and P the grating period.

The path of the sub-beams reflected by the grating incorporates a lens system $L_1$ which converts the different directions of the sub-beams into different positions $u_n$ of these sub-beams in a plane 73:

$$U_n = f_1 \cdot \alpha_n \quad (8)$$

In this plane, means are provided for further separating the different sub-beams. To this end, a plate may be arranged in this plane, which is provided with deflection elements in the form of, for example wedges 80-86. In FIG. 5, the wedge plate is denoted by WEP. The wedges are provided on, for example the rear side of the plate. A prism 72 can then be provided on the front side of the plate, with which an alignment beam coming from the radiation source 70, for example a He—Ne laser can be coupled into the alignment unit. This prism can also prevent the 0-order sub-beam from reaching the detectors. The number of wedges corresponds to the number of sub-beams which is to be used. In the embodiment shown, there are six wedges per dimension for the plus orders so that the sub-beams can be used up to and including the 7-order for the alignment. All wedges have a different wedge angle so that an optimal separation of the different sub-beams is obtained.

A second lens system $L_2$ is arranged behind the wedge plate. This lens system images the mark $P_1$ in the plane of reference plate RGP. In the absence of the wedge plate, all sub-beams would be superimposed in the reference plane. Since the different sub-beams through the wedge plate are deflected at different angles, the images formed by the sub-beams reach different positions in the reference plane. These positions $X_n$ are given by $$X_n = f_2 \cdot \gamma_n \qquad (9)$$

in which $\gamma$ is the angle at which a sub-beam is deflected by the wedge plate.

Figure 6:
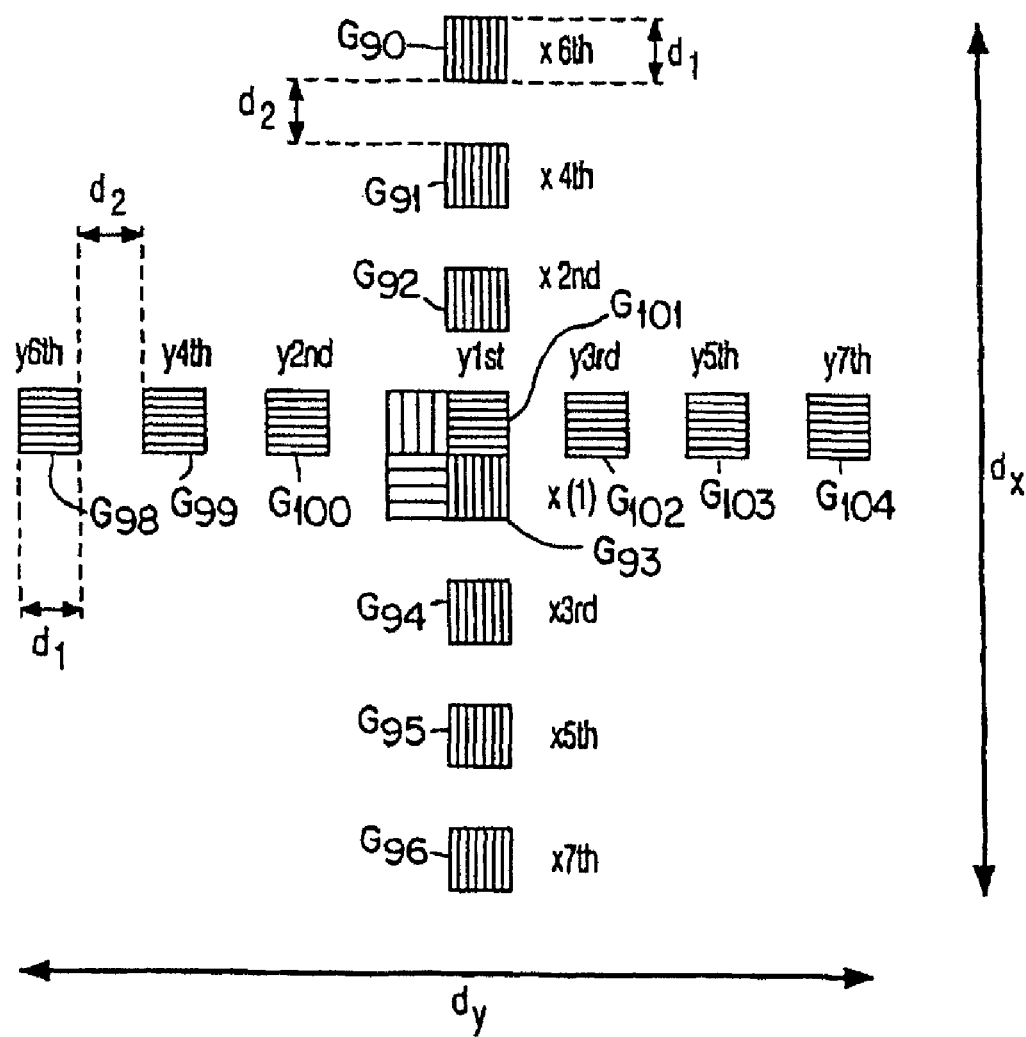
FIG. 6 shows a plate with reference gratings used in an embodiment of the invention.

At these positions, reference gratings $G_{90}$-$G_{96}$ can be provided, as is shown in FIG. 6. A separate detector 90-96 is arranged behind each of these reference gratings. The output signal of each detector is dependent on the extent to which the image of the substrate grating $P_1$ coincides with the relevant reference grating. Hence, the extent of alignment of the substrate grating, and thus of the substrate, can be measured with each detector 90-96. However, the accuracy with which the measurement takes place is dependent on the order number of the sub-beam used; as this order number is larger, the accuracy is greater. In FIG. 6, it has been assumed for the sake of simplicity that all reference gratings $G_{90}$-$G_{96}$ have the same grating period. Actually, however, the grating period of each grating is adapted to the order number of the associated sub-beam. As the order number is larger, the grating period is smaller and a smaller alignment error can be detected.

Hitherto only one set of diffraction orders has been considered. As is known, a diffraction grating forms, in addition to +1, +2, +3 etc order sub-beams, also sub-beams of diffraction orders −1, −2, −3 etc. Both the plus orders and the minus orders sub-beams can be used to form the grating image, i.e. a first image of the grating mark is formed by the +1 and −1 order sub-beams jointly, a second image is formed by the +2 and −2 order sub-beams jointly, and so forth. For the +1 order and the −1 order sub-beams no wedges need to be used, but plane-parallel plates which compensate for path-length differences can be provided at the positions of these sub-beams in the plane of the wedge plate. Thus six wedges, both for the plus orders and for the minus orders, are required for the orders 2-7.

Figure 7:
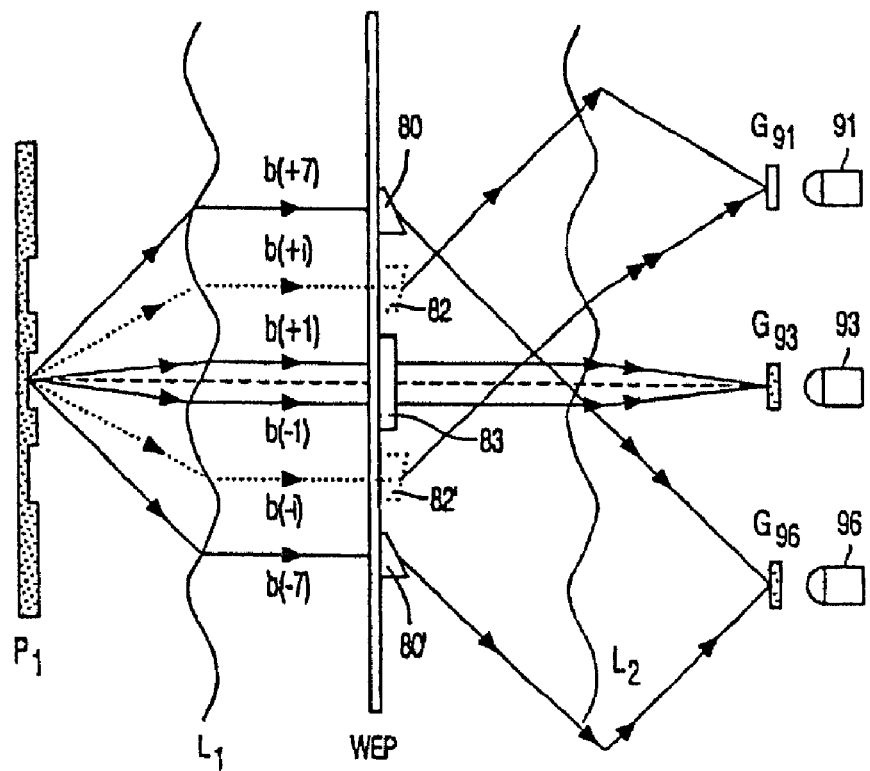
FIG. 7 shows the deflection by the wedge elements in an embodiment of the invention.

FIG. 7 illustrates more clearly the functioning of the wedges of the embodiment of FIG. 5. In the more schematic FIG. 7, the first lens system $L_1$ and the second lens system $L_2$ are represented by wavy lines. For clearness sake only the sub-beams of the first orders b(+1) and b(−1), the sub-beams of the seventh order b(+7) and b(−7) and the sub-beams of another order b(+i) and b(−i), for example the fifth order, are shown. As FIG. 7 illustrates, the wedge angles, i.e. the angle which the inclined face of the wedge makes with the plane surface of the wedge plate WEP, of the wedges 80 and 80' are such that the sub-beams b(+7) and b(−7) are deflected in parallel directions and converged by the second lens system on one reference grating $G_{96}$. Also the sub-beams b(+i) and b(−i) are deflected by the associated wedges 82 and 82' in parallel directions and converged on one reference grating $G_{91}$. The first order sub-beams are not deflected and are converged by the second lens system on one reference grating $G_{93}$. By using both the plus order and the minus order of each diffraction order a truthful image of the substrate grating mark $P_1$ is formed on the associated reference grating and a maximum use is made of the available radiation.

Figure 8:
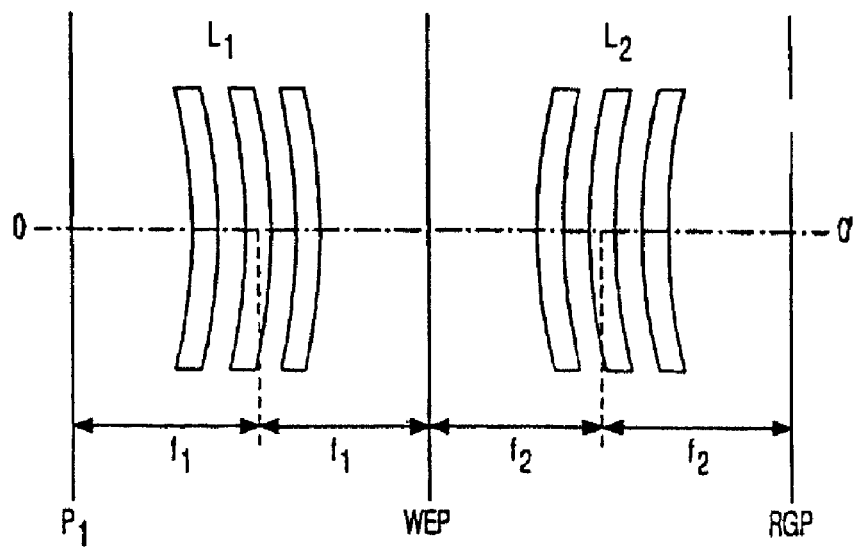
FIG. 8 shows a preferred arrangement of the first and second lens systems in the alignment unit according to an embodiment of the invention.

FIG. 8 shows the preferred positions, with respect to the plane of the mark $P_1$ and the reference grating plate RGP, of the lens systems $L_1$ and $L_2$ and the focal lengths of these lens systems. The lens system has a focal length $f_1$ and this system is arranged at a distance $f_1$ from the plane of the mark P. The lens system $L_1$ deflects the chief rays of the sub-beams in directions parallel to the optical axis OO'. The distance between the first lens system and the second lens system is equal to $f_1 + f_2$ whereby $f_2$ is the focal length of the second lens system. The reference grating plate is arranged at a distance $f_2$ from the second lens system. As in the path between the two lens systems the chief rays of the sub-beams are parallel to the optical axis OO', the position of the wedge plate is not critical.

In order that in the embodiment of FIG. 4 the plus- and minus order sub-beams of the same diffraction order are deflected such that they can be correctly superposed by the second lens system on the associated reference grating, stringent requirements are to be set to the mutual quality of the two associated wedges. These quality requirements relate to the quality of the inclined faces of the wedges and to the wedge angles.

Figure 9:
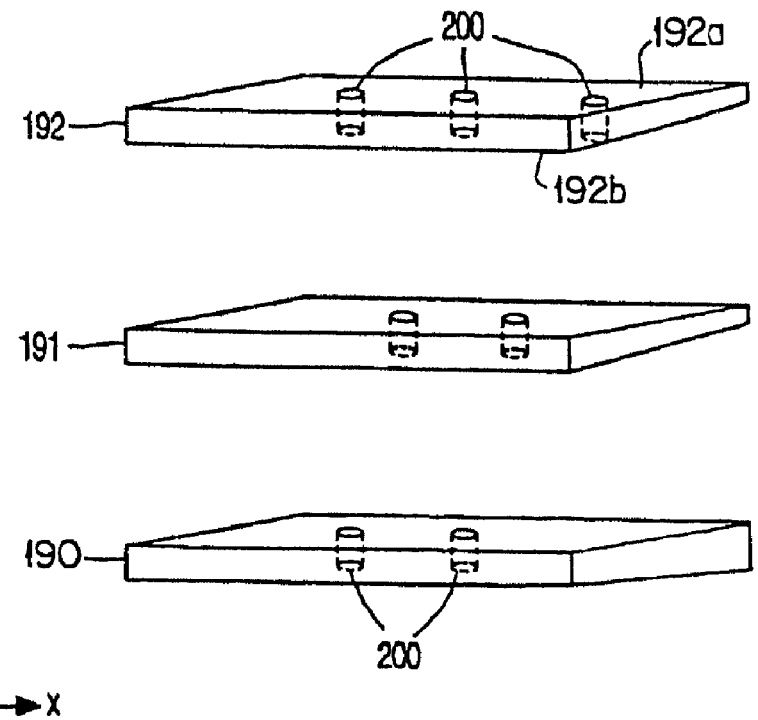
FIG. 9 shows a series of wedge-shaped plates to be used as the structure of deflection elements in a second embodiment of the alignment unit.

To lessen said requirements and to release the tolerances of the alignment unit, preferably use is made of the structure of deflection elements shown in FIG. 9. Instead of one discrete wedge for each sub-beam a number of, for example three, wedge plates 190, 191, 192, which are common to all sub-beams, are used. FIG. 9 shows a perspective view and FIG. 10 a side view of the wedge plates. The wedge angle, i.e. the angle between the upper face and the lower face of a plate, for plate 192 the angle between the face 192a and the face 192b, are different for the three plates. One of the plates, for example plate 190, has a wedge angle which is opposite to those of the other plates. The plates are provided with a number of openings 200, only a few of which are shown in FIG. 9. These openings are arranged at positions where sub-beams are incident on the relevant plate. However, not at every such position an opening is present. If a sub-beam is incident on an opening in a plate it will not be deflected by this plate.

Figure 10:
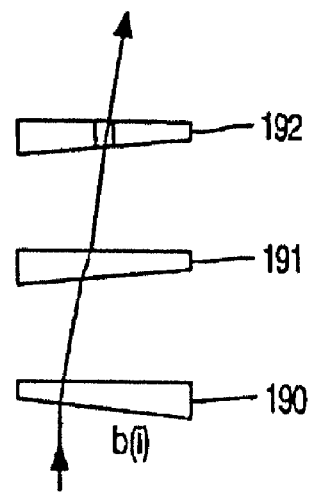
FIG. 10 illustrates how this series deflects a sub-beam.

On its way through the plates a sub-beam will encounter, zero, one or two openings. Only the first order sub-beams encounters zero openings and is not deflected by any of the plates. In FIG. 10 the path through the plates of one of the sub-beams is shown. This sub-beam is deflected to the right by the first plate 190. Subsequently this sub-beam is deflected over a smaller angle to the left. Finally this sub-beam passes through an opening 200 in the plate 192 so that no further deflection occurs. For each of the sub-beams the number of openings and the order of the plate in which such opening is present is different from those of the other sub-beams, so that the sub-beams are all deflected in different directions. It will be clear that with a combination of three plates $2^3 = 8$ different deflection directions can be realized. As a pair of sub-beams of the same diffraction order is deflected by the same wedge plates, the risk that these sub-beams are not deflected in parallel directions is minimized.

In the embodiment of FIGS. 5 and 6, sub-beams with an order number of 1 to 7 are used so that seven reference gratings $G_{90}$-$G_{96}$ are necessary for the alignment in the X direction. For the alignment in the Y direction, seven sub-beams may also be used together with seven further reference gratings $G_{93}$-$G_{104}$, as is shown in FIG. 6. A second series of twelve wedges is then arranged on the wedge plate in the Y direction in the embodiment of FIG. 5. In the embodiment of FIG. 9 a second series of three wedge plates is then arranged in the path of the sub-beams before or behind the first series of wedge plates, which second series of plates deflect the sub-beams in Y-directions. The substrate mark may be the mark shown in FIG. 2 or other types of marks, e.g., marks provided along the scribe lines. For the first-order sub-beams, a similar reference grating may be used with four grating portions, two of which have a grating period of 16.0 μm, while the two other grating portions have a period of 17.6 μm as is shown in FIG. 6. The other reference gratings have only one grating period which corresponds to the relevant diffraction order of the grating portions with a period of 16 μm of the substrate grating $P_1$. The capture range of 44 μm associated with the grating mark $P_1$ of FIG. 2 is then maintained.

In the embodiment of FIGS. 5 and 6, the sub-beams having the highest order number are deflected by the deflection elements through the largest angle. However, this is not necessary. Under circumstances, this order may be modified, for example for minimizing optical aberrations in the grating images. That may also be the reason why the sub-beams with an ascending order number are deflected by the wedges alternately at a positive angle and a negative angle, as is shown in FIG. 6.

The minimum number of diffraction orders which has to be detected to be able to align in a sufficiently accurate way at a given asymmetry of the substrate mark $P_1$ can be determined by means of computer simulations. Such simulations have proved that, for example an alignment error of 150 nm which remains when a first-order sub-beam is used can be reduced to 20 nm when a fifth-order sub-beam is used.

In principle, the maximum number of orders which can be detected is determined by the minimum intensity which can still be detected and by the numerical aperture of the lens system $L_1$, $L_2$. As is known, the intensity of the sub-beam formed by a diffraction grating quickly decreases with an increase of the order number of this sub-beam; the intensity of a sub-beam is inversely proportional to the square of the order number of this sub-beam. For a seventh-order sub-beam, the intensity is thus approximately 1/50 of that of a first-order sub-beam. The intensity loss due to reflections undergone by an alignment beam when traversing the off-axis alignment unit is, however, considerably smaller than when it traverses an on-axis alignment unit. In the last-mentioned unit, the alignment beam meets, for example approximately one hundred surfaces on which reflection losses may occur and in the first-mentioned unit it meets, for example only twenty of these surfaces. If the total reflection loss is a factor of four in the off-axis alignment unit, the 7-order alignment sub-beam may have as much intensity as a 1-order alignment beam in the on-axis alignment unit.

The numerical aperture $NA_n$ which the optical system $L_1$, $L_2$ must have to pass a sub-beam with a diffraction order of N is given by:

$$NA_n = \sin N \cdot \frac{\lambda}{P} \quad (10)$$

For a 7-order sub-beam and a substrate grating mark with a grating period p=16 μm and a wavelength λ=544 nm, the desired numerical aperture is approximately 0.24, which is a very acceptable number.

To guarantee a sufficiently stable system, the different reference gratings are provided on a single plate RGP which preferably consists of quartz. The dimensions of this plate, hence the image field of the second lens system, are determined by the dimension $d_1$ of the reference gratings and their mutual distance $d_2$. This distance and dimension are, for example, both 0.2 mm so that the dimensions $d_x$ and $d_y$ in the X and Y directions of the plate RGP are 2.8 mm and the desired field diameter is approximately 3 mm.

The discrete wedges of the embodiment of FIG. 5 may be made of glass or quartz and fixed to a quartz plate. This structure shows a high degree of stability. The wedges may also be made of a transparent synthetic material, for example an UV curable plastics. In that case it is preferred to use a replication technique, known per se in optics, to print the whole wedge structure by means of a mould in one run in a thin layer of this material, which layer is applied to, for example a quartz substrate. As already remarked, instead of discrete wedges preferably wedge plates provided with openings are used. Instead of discrete wedges or wedge plates other deflection elements may be alternatively used, such as diffraction gratings of which only one order is used. Furthermore it is possible to use deflection structures constituted by patterns of refractive index variations in the material of a plate, which patterns are provided, for example by means of ion implantation.

Figure 11:
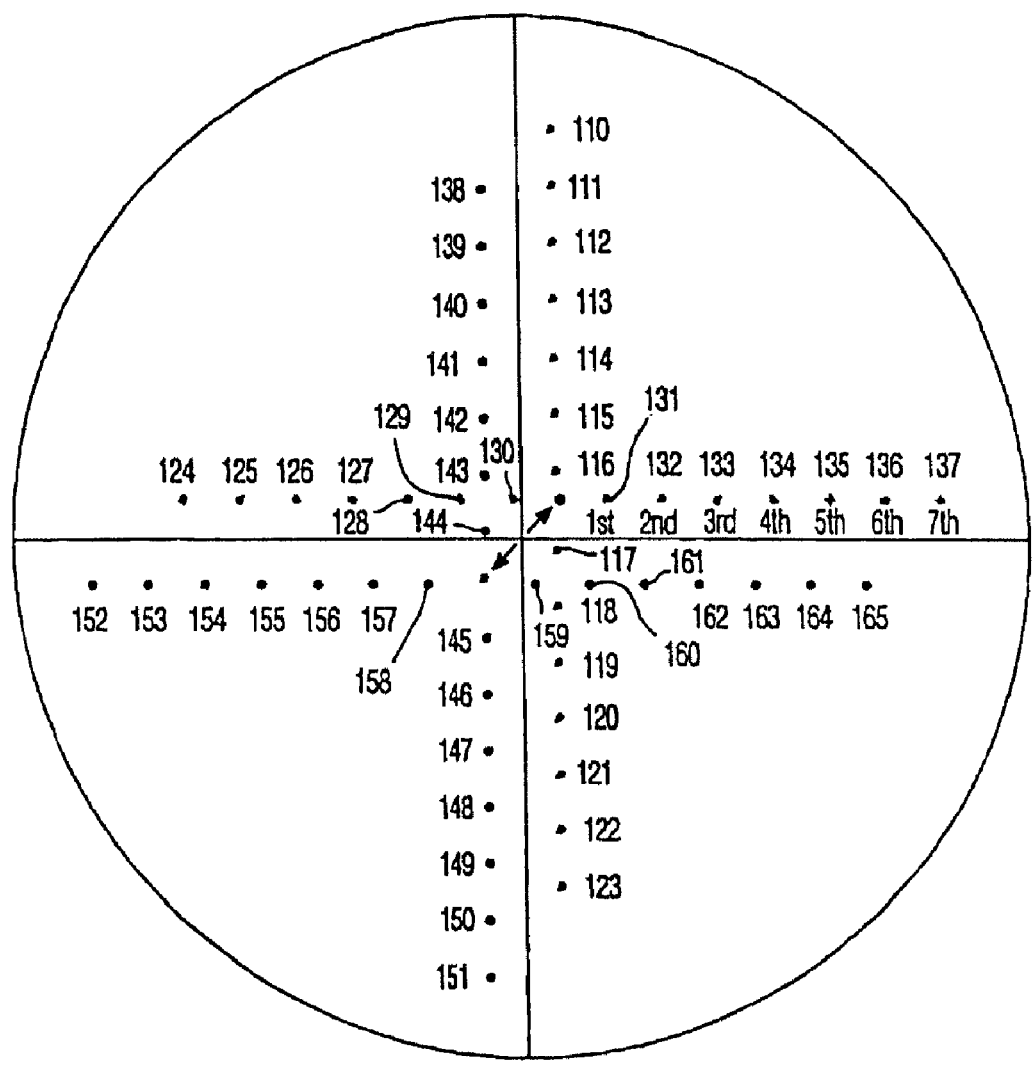
FIG. 11 shows the positions of the sub-beams in the plane of this plate in an embodiment of the alignment unit in which alignment radiation with two wavelengths is used.

In order that not too stringent requirements have to be imposed on the groove depth of the substrate mark, alignment radiation having two wavelengths, for example 633 nm and 532 nm, have been found to be suitable. Use can be made of the fact that the angles at which the alignment grating deflects the sub-beams and the positions which these beams occupy in the rear focal plane of the lens system $L_1$ is dependent on the wavelength, as is apparent from the expressions (7) and (8). In principle, the orders for the different wavelengths can be distinguished from each other. Without further measures, however, a given order, for example the second order of the first wavelength (633 nm) may come between, for example the second and third orders of the second wavelength (532 nm). To separate the orders of the different wavelengths better from each other, it can be ensured that the beams with the different wavelengths are incident at different angles on the substrate grating $P_1$. For the case where seven diffraction orders are used, the situation as shown in FIG. 11 is then created in the rear focal plane of the lens system $L_1$. Now, there is a first cross-shaped pattern of positions 110-137 for the different orders of the first wavelength and a second cross-shaped pattern of positions 138-165 for the different orders of the second wavelength. As is shown by means of the double arrow in the center of FIG. 7, these patterns are offset with respect to each other, which is due to the different angles of incidence of the alignment beams with the different wavelengths. These angles should be maintained as minimal as possible so as to prevent alignment errors occurring due to defocusing effects. When using two wavelengths, the plate with deflection elements must of course be adapted to the situation as is shown in FIG. 11, which means, inter alia, that instead of 24 discrete wedges 48 wedges must be used, or that instead of 6 wedge-shaped plates twelve of such plates must be used.

Figure 12:
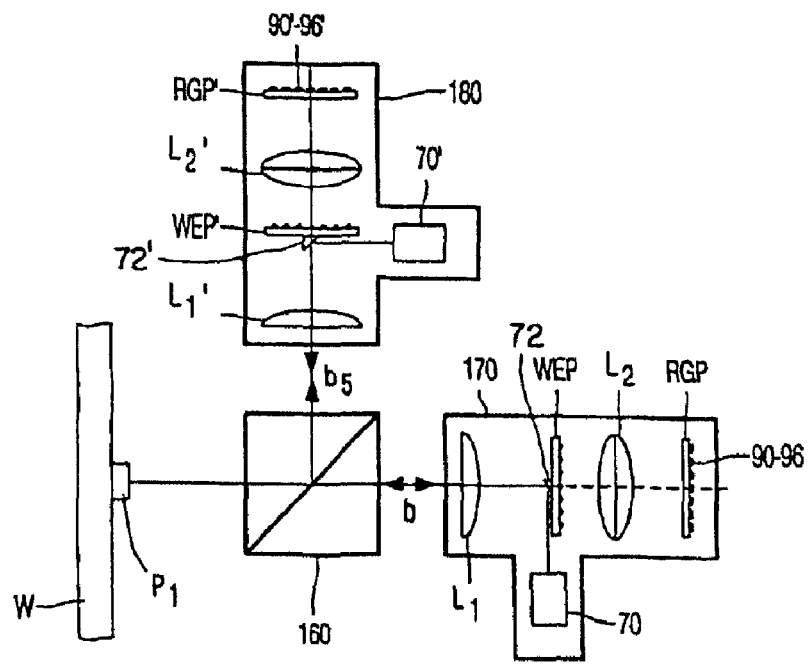
FIG. 12 shows an embodiment of the alignment unit in which two wavelengths are used.

An alternative for the alignment with two wavelengths is illustrated in FIG. 12. In this figure, the reference numeral 160 denotes a polarization-sensitive beam splitter. This beam splitter receives a first alignment beam b having a first wavelength $\lambda_1$, for example 633 nm, from a He—Ne laser, and having a first direction of polarization and passes this beam to the substrate alignment mark $P_1$. Incident on this beam splitter is also a second alignment beam $b_5$ which has a second wavelength $\lambda_2$, for example 532 nm and comes from a YAG laser preceding a frequency doubler. The beam $b_5$ has a direction of polarization which is perpendicular to that of the beam b so that the beam $b_5$ is reflected to the substrate mark $P_1$. It has been ensured that the chief rays of the beams b and $b_5$ are made to coincide by the beam splitter so that these beams will be passed as one beam to the mark $P_1$. After reflection by the mark, the beams b and $b_5$ are split again by the beam splitter. A separate alignment unit 170, 180 is present for each of these beams. Each of these units emits an alignment beam and receives, via the beam splitter, the sub-beams of the different diffraction orders coming from the substrate mark. In each of these units, images of the substrate mark are formed on different reference gratings and with different sub-beams, as has been described with reference to FIG. 5. To this end, each unit is provided with a lens system $L_1$, $L_2$, ($L_1'$, $L_2'$), a wedge plate WEP (WEP') and FIG. 9 or a series of wedge-shaped plates, a plate with reference gratings RGP (RGP'), a number of detectors 90-96 (90'-96') and a radiation source 70 (70') whose beam is coupled into the system via a coupling prism 72 (72').

Figure 13:
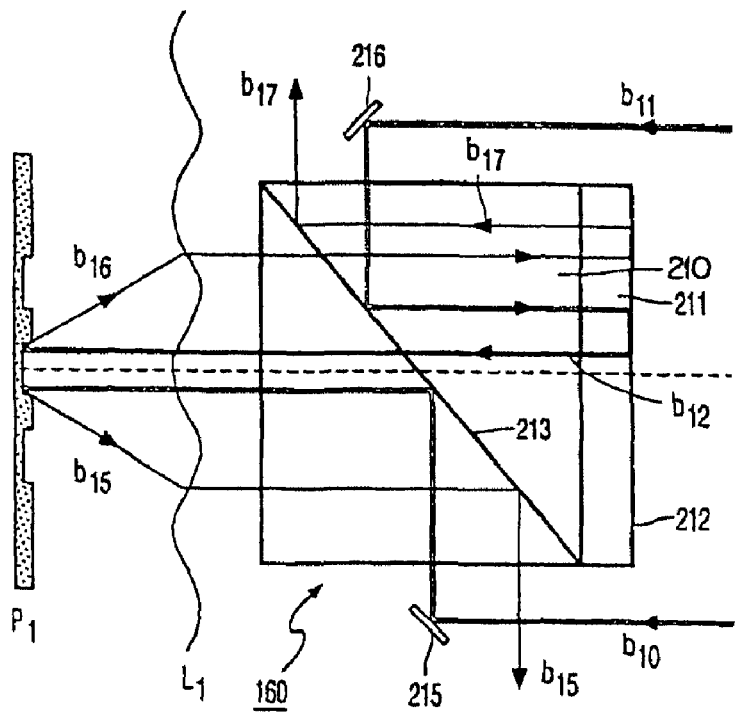
FIG. 13 shows a preferred beam splitter for use in this embodiment.

FIG. 13 shows part of an embodiment of the alignment unit wherein a special kind of beamsplitter 160 is used. This beamsplitter comprises a polarization-sensitive beam splitting prism 210, a quarter-wave plate 211 and a reflector 212. The beams $b_{10}$ and $b_{11}$ having different wavelength and coming from sources, not shown, are indicated by thick lines and the beams reflected by the grating mark $P_1$ by thin lines. The beams $b_{10}$ and $b_{11}$ have the same polarization direction. The first beam $b_{10}$ is reflected by a reflector 215 towards the polarization-sensitive beam-splitting layer 213 in the prism 210. This layer reflects the beam $b_{10}$ towards the grating mark $P_1$. The radiation reflected by the grating mark and split up in sub-beams of different diffraction orders is represented by one single beam ray $b_{15}$. The beam $b_{15}$ is reflected by the layer 213 towards the associated structure of deflection elements and detectors which are not shown in FIG. 13.

The second beam $b_{11}$ is reflected by the reflector 216 towards the beam-splitting layer 213 which reflects the beam towards the quarter-wave plate 212. After the beam $b_{11}$ has passed this plate it is reflected by the reflective layer 212 at the backside of this plate, so that it passes for a second time through the plate 211. The beam $b_{12}$ leaving the plate 211 has a polarization direction which is rotated over 90° with respect to the polarization direction of the original beam $b_{11}$. The beam $b_{12}$ can pass the beam splitting layer 213 and reach the grating mark $P_1$. The radiation reflected by this mark is also indicated by a single beam ray $b_{16}$. This beam passes first the beam-splitting layer 213, then traverses twice the quarter-wave plate 211 and finally is reflected by the layer 213 towards the associated structure of wedges and detectors, not shown in FIG. 13. It is only for clearness sake that in FIG. 13 the reflected beams $b_{16}$ and $b_y$, are represented as spatially separated beams; in practice these beams coincide. The same holds for the beams $b_{10}$ and $b_{11}$ at the position of the mark $P_1$.

In the embodiments of FIGS. 12 and 13 the first lens system $L_1$ is preferably arranged between the beam splitter 216 and the grating mark $P_1$, as shown in FIG. 13. This has the additional advantage that only one such lens system is needed for the two beams of different wavelengths. For the reflected beams separate second lens systems $L_2$, not shown in FIG. 13, remain necessary.

In the different embodiments described above the detectors are arranged directly behind the reference gratings. In practice however, behind the reference gratings a bundle of imaging fibers may be arranged which image each of reference gratings and the superposed image of the substrate grating mark at a detector at a remote location, which is more convenient with respect to the design of the whole apparatus and with respect to the performance of this apparatus. For example, cross-talk between the images formed by the sub-beams of the different diffraction orders can be decreased and heat generated by signal amplifiers and electronic processors can be kept away from the alignment unit and the apparatus. Also the radiation sources may be arranged at positions remote from the alignment unit and their radiation can also be guided to the unit by an illumination bundle of fibers. In this way the heat generated by the radiation sources can be kept away from the alignment unit and the projection apparatus.

Between the prism 216 and the second lens system L2 for one of the beams $b_{15}$ and $b_{17}$ a partially transmitting reflector may be arranged to split off a portion of this beam towards a camera which, together with a monitor, provides a visual image of the substrate mark to an operator of the apparatus.

There are different possibilities of using the various detector signals. A start may be made with the alignment by means of the first-order sub-beams by processing the signals of the detectors associated with these sub-beams. Subsequently, the signals of the detectors associated with the second-order sub-beams may be used for finer alignment, then the signals of the detectors associated with the third-order sub-beams may be used for even finer alignment, and so forth. This may continue as long as the sub-beams used still have sufficient intensity to be detected in a reliable manner.

Another possibility is based on the recognition that the intensity of certain diffraction orders is increased at the expense of other diffraction orders when given process layers are provided on the substrate. In that case, a direct choice of the preferred orders may be made for the alignment. Under circumstances, said possibilities may also be combined.

It is also possible to calibrate the alignment unit before a batch of substrates is illuminated with a mask pattern or at the beginning of a production day. For a number of positions of the substrate mark the detector signals for each of the diffraction orders are measured. The results of these measurements are stored in graphs or tables showing for each position of the substrate mark the value of the detector signal for each diffraction order. During illumination of the substrates, the alignment measurement can be performed by measuring only the relatively large detector signals of the lower diffraction orders, for example the first three orders. By interpolation the corresponding value for a higher diffraction order, for example the seventh order, can be determined. In this way it is possible to determine alignment errors with high resolution and large signal amplitude.

Hitherto, only the alignment of the substrate with respect to an apparatus reference in the form of reference gratings has been described. With the same alignment unit also the position of the substrate holder or table can be determined. To that end this holder or table is provided with an alignment mark similar to the substrate alignment mark. (See, e.g., the fiducial mark illustrated schematically in FIG. 4.) The position of the substrate holder mark with respect to the reference in the alignment unit is determined. The position of the substrate mark with respect to the substrate holder mark is then known. To be able to fix the mutual position of the mask pattern and the substrate, a further measurement is necessary, namely that of the position of the mask pattern with respect to the substrate holder or table. For this further measurement, the on-axis alignment unit described with reference to FIGS. 1, 2 and 3 may be used, with which mask marks are aligned with respect to marks of the substrate holder. Not only the double alignment unit as shown in FIG. 3 but also a single alignment unit as described in U.S. Pat. No. 4,251,160 may be used.

Figure 14:
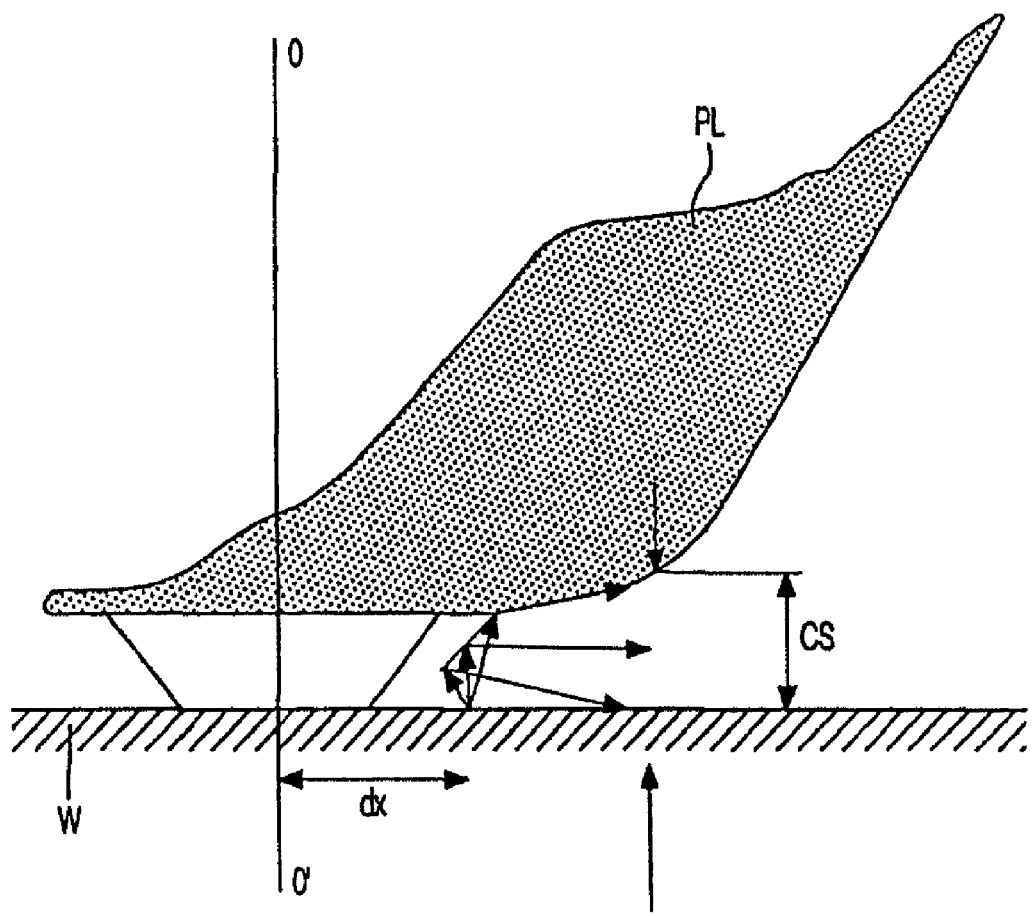
FIG. 14 shows the position of the alignment unit with respect to the projection lens and the substrate.

Another possibility of aligning the mask pattern with respect to the substrate table is the use of the image sensor unit described in, for example U.S. Pat. No. 4,540,277. In such a unit, a mask alignment mark is imaged by means of projection radiation on a corresponding and transmissive reference mark in the substrate table. In this table, a detector may be arranged behind the reference mark for converting the radiation passed by the reference mark into an electric signal. In the first instance, this image sensor unit is intended for, for example calibrating an on-axis alignment unit which operates with alignment radiation having a wavelength which is considerably different from that of the projection radiation, or for checking the image quality of the image formed by the projection lens system and for measuring distortions and aberrations which may occur, but it is also eminently suitable for aligning the mask pattern with respect to the substrate table. Instead of the transmission image sensor unit described in U.S. Pat. No. 4,540,277, an image sensor unit operating in reflection may be alternatively used for aligning a mask mark with respect to a substrate table mark. Such a unit, which is described in U.S. Pat. No. 5,144,363, operates with a reflective mark on the table and comprises a relatively large number of detectors which observe the mark at different angles and which, together with the associated optical systems, are provided in a sensor plate which is arranged between the projection lens system and the substrate table. The off-axis alignment unit according to the invention must also be provided in this space. This unit must be arranged as close as possible to the center of the substrate table and requires a building space which is conical with an aperture of, for example 0.3. In practice, the length of the Y side of the substrate table approximately corresponds to the radius of the substrate for which the projection apparatus has been designed, for example 102 mm for an 8-inch substrate, so that there is little room for building in the alignment unit in this direction. The X side of the substrate table is, however, for example 25 mm longer than the Y side, so that an alignment unit which can handle an 8-inch substrate can be placed at a distance of 25 mm from the optical axis of the projection lens system. This is shown very diagrammatically in FIG. 14 which shows a part of the projection lens system PL and its optical axis OO'. The portion between the projection lens system and the substrate indicates the space which is occupied by the projection beam, and the arrows marked b indicate sub-beams of the alignment radiation. The alignment beam is incident on the substrate at a distance dx from the axis OO' which distance is thus, for example 25 mm. The reference CS denotes the critical position for the available building space. At this position, the diameter of the cone within which the sub-beams with the different diffraction orders are situated is equal to the distance to the substrate, multiplied by twice the value of the numerical aperture. For a numerical aperture of 0.25 and a value of 32 mm for said distance, said diameter, hence the required vertical space at the location of CS, is 16 mm. This is a reasonable requirement in practice. However, this vertical space may not be completely available. In that case, two off-axis alignment units may be used which are arranged diametrically with respect to each other and can each cover a part of the substrate.

As hitherto described the off-axis alignment unit is arranged in the projection column, comprising the mask holder, the projection system and the substrate holder, of the lithographic projection apparatus. With the increasing demand for larger IC's having smaller details, and thus comprising more electronic components, the alignment procedure becomes more and more time-consuming. The throughput of these apparatuses therefore tends to decrease without further measures taken. It has already been proposed to add to such an apparatus a separate measuring station. In this station the position in, for example the X-, Y- and Z-direction, of a substrate is measured before this wafer is brought in the projection column, or projection station. In the measuring station substrate marks can be aligned with respect to alignment marks on the substrate holder or table. After the substrate, together with the holder has been placed in the projection system only a mask alignment mark needs to be aligned with respect to the substrate holder mark, which takes only a short time. As in the apparatus, comprising a separate measuring station and projection station, during the illumination of a first substrate in the projection station a second substrate is being measured in the measurement station, the throughput of this apparatus is considerably larger than in an apparatus without a separate measurement station. The alignment unit used in the measuring station for aligning a substrate mark with respect to a substrate holder mark is preferably an off-axis alignment system as described herein.

The off axis alignment systems described above are examples of alignment systems that have a plurality of sensors which produce a plurality of signals that can be combined to determine the position of an alignment mark. In those examples, there are sensors that produce signals from the alignment mark for separate diffraction orders of light diffracted from the alignment mark. In the particular embodiments described, separate orders from the first order up to the seventh order can be detected. Furthermore, this is done for each of the X and Y directions. In addition, each of the seven orders in the X and Y directions can be detected at two different wavelengths of light illuminating the alignment mark. Consequently, this provides a total of 28 channels that provide signals substantially simultaneously during an alignment scan. One could also receive signals that are switched in time, rather than being simultaneous, without departing from the scope and spirit of this invention, especially if there is a rapid switching. According to the instant invention, information from a plurality of channels of such a multi-sensor alignment system are combined to obtain improved alignments. Improved alignment includes improved precision to align on a smaller scale and/or reduced errors due to systematic effects, such as processing effects, and/or improved reproducibility. It also includes "fallback procedures" in which alternative alignment steps or strategies are available to replace a failed strategy. In an embodiment of this invention, signals from a plurality of different diffraction orders are combined to determine a position of an alignment mark. In this embodiment, detected positions of an alignment mark from a plurality of diffractive-order channels are fit to a curve which can be expressed as a continuous function and then this continuous function is used to predict a position that would be obtained at substantially no systematic error.

An embodiment of such a predictive recipe has been found to be useful in the case where marks are deformed, for example when a semiconductor wafer undergoes the tungsten chemical mechanical polishing process (W-CMP). (The aluminum physical vapor deposition (Al-PVD) process is typically performed in conjunction with W-CMP. Therefore, when we refer to W-CMP one should understand that it can also include Al-PVD.) FIGS. 15A-15D illustrate systematic effects that occur during the W-CMP processing which can lead to systematic errors in the detection of a target on a wafer.

Figure 15A:
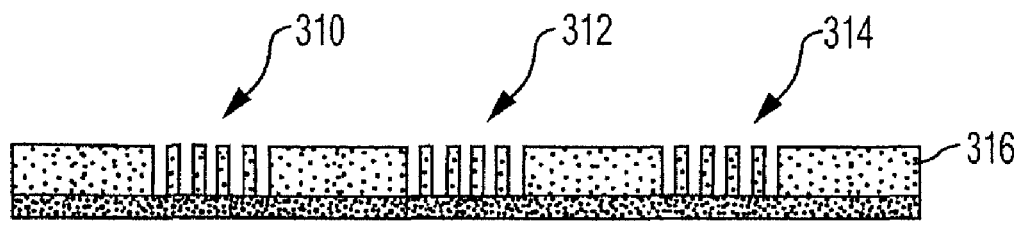
FIGS. 15A-15D illustrate asymmetric damage to alignment marks due to the tungsten chemical mechanical polishing (W-CMP) process.
Figure 15B:
Figure 15C:
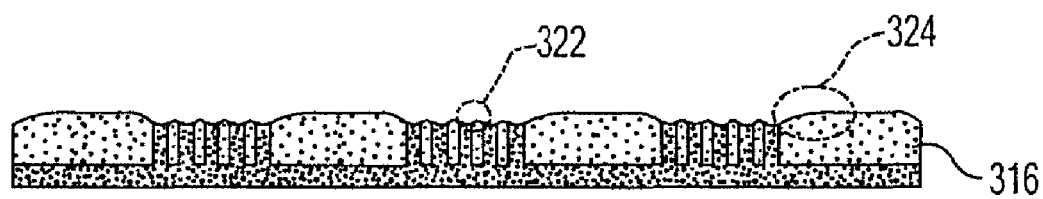
Figure 15D:
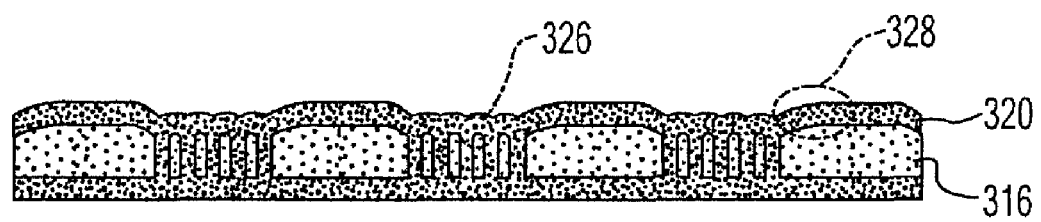

FIG. 15A illustrates three series of grooves 310, 312 and 314 etched into an oxide layer 316 which forms a multi-target mark, or a portion thereof. FIG. 15B shows a portion of the wafer after a tungsten deposition step. A tungsten layer 318 is deposited over oxide layer 316 as well as in grooves 310, 312 and 314. FIG. 15C shows the wafer after the W-CMP processing step. Finally, FIG. 15D illustrates a portion of the wafer after an aluminum layer 320 is deposited over that portion of the wafer. As one can see in FIGS. 15C and 15D, there are asymmetric changes to the oxide layer, for example 322 and 324, that are then also repeated in the aluminum layer, 326 and 328, due to the W-CMP processing. Such an asymmetric change to a diffraction grating that is used for an alignment mark leads to an apparent shift in the position of the alignment grating. This is a systematic effect introduced by the W-CMP processing step.

Figure 16:
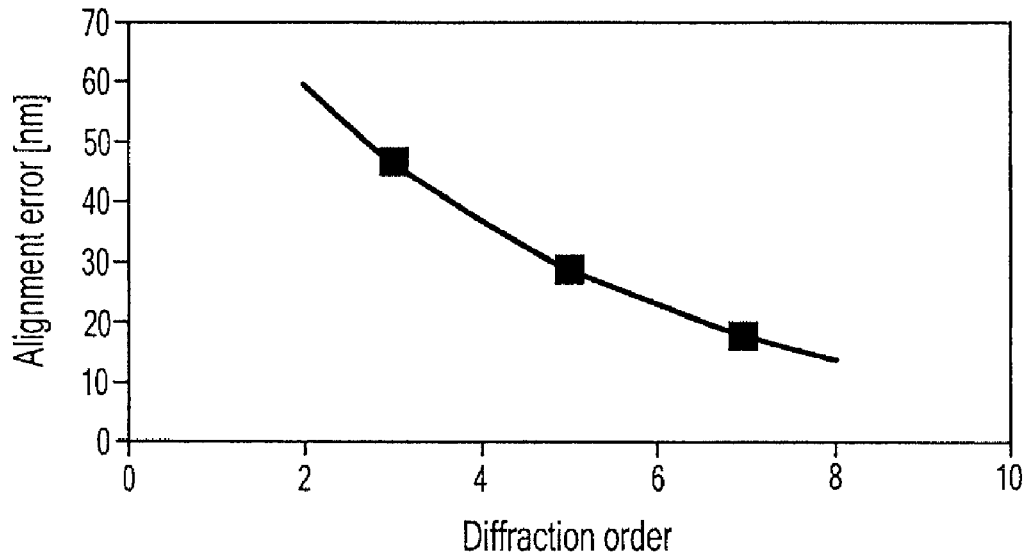
FIG. 16 shows alignment errors due to the W-CMP process as a function of diffraction order of the detection channel.

FIG. 16 is a plot of alignment errors introduced by the W-CMP process for three different diffractive order channels. In this case, the detected orders are the third, fifth and seventh diffractive-order channels. The data correspond to separate diffraction gratings for each detected order, as will be explained in more detail below. Such an embodiment has been found to provide good results, but the scope of this invention is not limited to only multi-grating marks. One can see that the error decreases with an increase in the detected diffraction order. The inventors found that a curve can be fit to such data and that the curve can be extrapolated to predict reduced alignment error that one would expect to see if the detection system were designed to detect corresponding higher orders.

Figure 17:
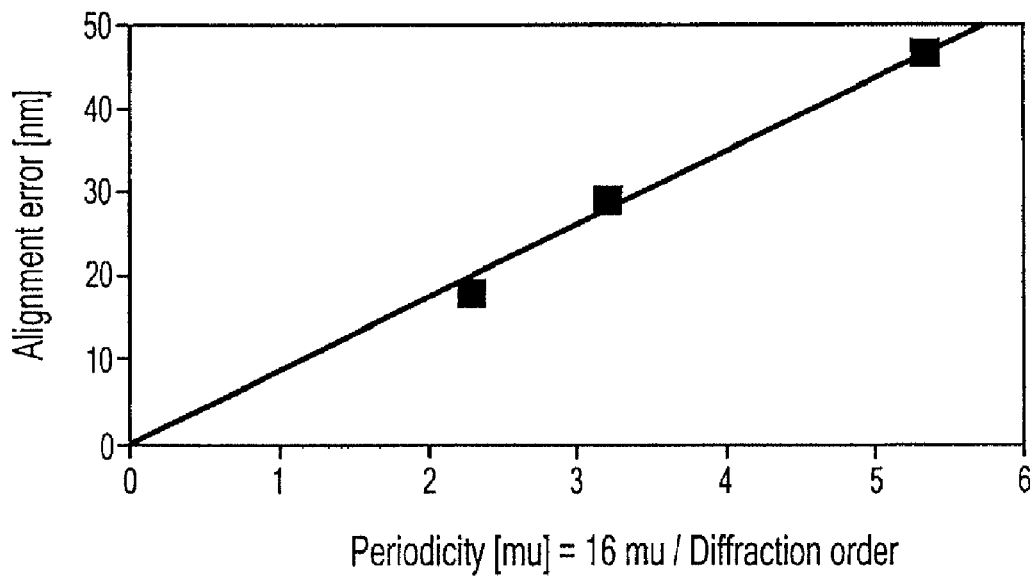
FIG. 17 shows the alignment errors of FIG. 16, plotted a different way.

FIG. 17 illustrates the same data plotted a different way. The alignment errors for each of the three detected orders are now plotted as the inverse of the diffraction order multiplied by a constant factor (the "periodicity"). Since the plot is in terms of an inverse proportionality, as one goes to an infinite diffraction order, the position in the graph would approach zero along the axis labeled periodicity. Plotted in this way, one can see that the data can be fit well by a straight line which approaches zero alignment error for the zero periodicity position. Therefore, by fitting a straight line to the measured alignment errors for a plurality of diffractive order channels, one can extrapolate to predict the target position in the case of zero alignment error which results from the W-CMP processing. The zero periodicity case corresponds to infinite diffractive order. Clearly, one cannot build a system that separately detects an infinite number of diffraction orders. However, the predictive method according to this embodiment of the invention allows one to project to such a limit of infinite detected diffraction orders.

The inventors have found good results with reducing errors due to the W-CMP processing by combining signals from the third diffractive order, the fifth diffractive order and the seventh diffractive order in the following linear combination $$X_{pred} = -0.9399x_3 + 0.6329x_5 + 1.307x_7, \quad (11)$$

which is based on a three point least squares fit to the following general equation $$x_{meas}(n) = C/n + x_{pred}, \quad (12)$$

where C is a constant and n is the order number.

Although the inventors have found good results using only three of the seven diffractive orders, the broader concepts of the invention are not limited to only the above-noted predictive recipe. Two or more diffractive-order channels may be used and measured values may be fit to other functions without departing from the general concept of this invention. Furthermore, this aspect of the invention is not limited to only providing a predictive recipe to correct for effects introduced in the W-CMP or similar processing.

In another example, the copper damascene process tends to introduce errors which appear to be substantially random as observed in the different wavelength and diffractive order channels. The inventors have found that a predictive recipe in which multiple available signal channels are averaged with equal weight tends to lead to good results for the Cu-damascene process. General concepts of this invention include combining information from a plurality of diffractive order channels to obtain an improved accuracy of detecting an alignment mark on a substrate compared to using a single channel alone. Such predictive recipes may take particular forms for particular processes performed on the substrate as described above for the case of the W-CMP process and for the Cu-damascene process. Furthermore, the concepts of this invention are not limited to only combining information from a plurality of wavelength channels and diffractive-order channels to provide predictive recipes to account for processing effects on a substrate. Information from a plurality of wavelength channels and diffraction order channels may be combined to provide predictive recipes to account for other changes to a substrate that may lead to errors in determining the position of an alignment mark.

Figure 18:
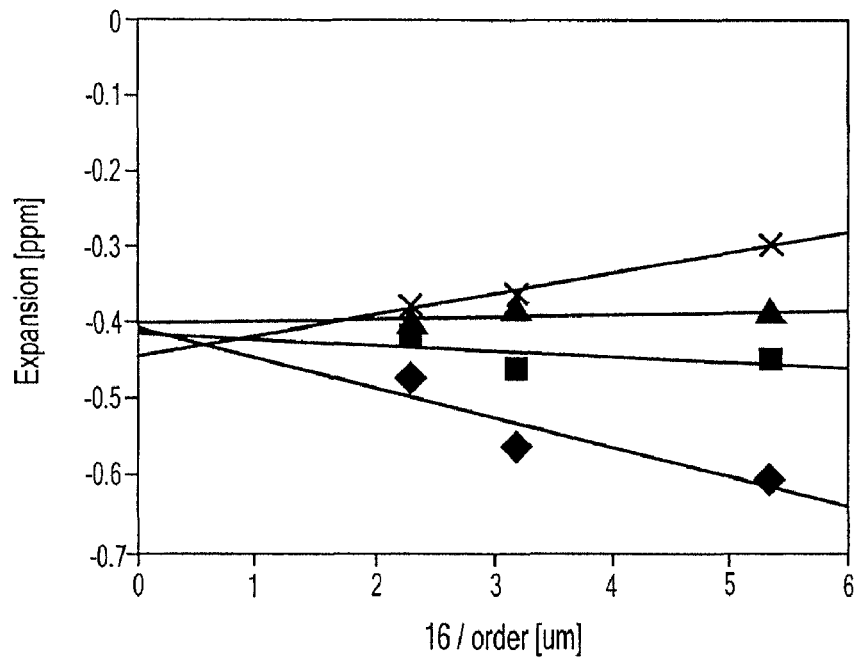
FIG. 18 shows false expansion errors due to the W-CMP and aluminum physical vapor deposition (Al-PVD) process as a function of periodicity for four semiconductor wafers.
Figure 19:
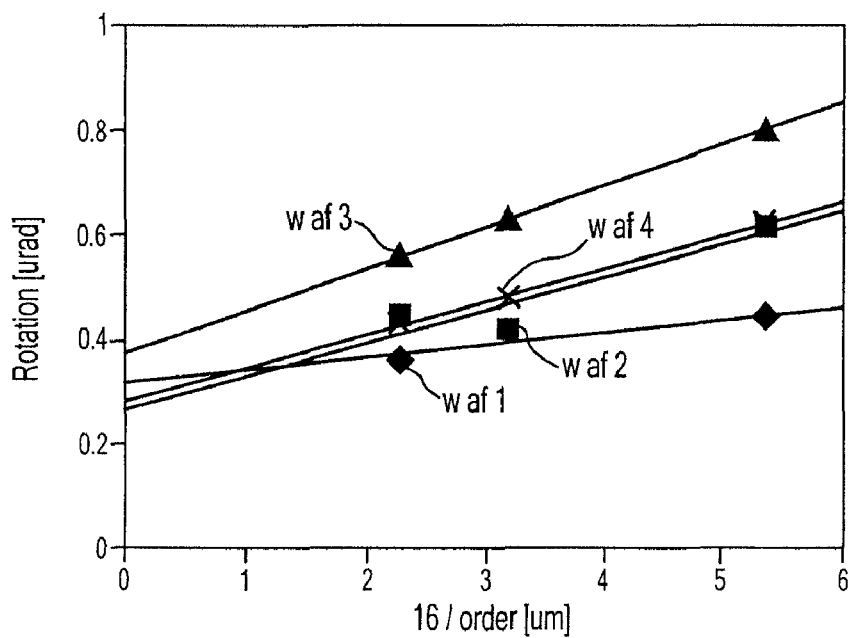
FIG. 19 shows false rotation errors due to the W-CMP and AL-PVD process as a function of periodicity for four semiconductor wafers.

The processing steps may introduce systematic effects that vary from substrate to substrate. For example, an apparent expansion due to a W-CMP and Al-PVD processes is plotted in FIG. 18 as measured for the third, fifth and seventh diffractive order channels for four different silicon wafers. The inventors found that such errors due to expansion and contraction vary with the detected diffraction order and also vary from substrate to substrate. As one can see in FIG. 18, the variation with the periodicity, which is inversely proportional to the diffractive order, has a substantially linear variation for each wafer. However, the lines fit to the data for each wafer are different straight lines (e.g., different slopes). Notice that the straight lines approach each other for a decrease in periodicity, corresponding to increasing diffractive order. Consequently, such a predictive recipe permits one to project to results which are substantially invariant from wafer to wafer. Similarly, false rotations introduced by the W-CMP and AL-PVD processing can be projected to decreased or substantially vanishing wafer to wafer variation. FIG. 19 provides data illustrating a predictive recipe for reducing wafer to wafer variations in this case.

The above examples of predictive recipes may be viewed as static recipes in the sense that the information from the plurality of channels are combined with fixed coefficients. The term predictive recipe is intended to include the general concept of obtaining a mathematical representation of multi-channel information and then using the mathematical representation to determine the position of the alignment mark. The concepts of this invention also include dynamic recipes, within the general concept of predictive recipes, in which information from the various channels are combined in a way that depends on measured quantities. For example, information from a plurality of diffraction order channels may be combined with coefficients which depend on the measured signal strength. Other measured quantities may also be used in dynamic recipes. For example, the output signal may be fit to an expected functional form, such as a sinusoid. The correlation coefficient in such a fit provides another measured quantity which can be used in a dynamic recipe for combining signals from the plurality of channels. The use of other input parameters, such as "mccr", "minirepro", "signal to noise ratio" "signal shape", "signal envelope", "focus" "tilt" "order channels position offset" "wavelength channels position offset", "shift between segments"; and/or "coarse-fine position deviation", possibly in combination with user input parameters, can enhance the performance.

Many of these parameters are related to the accuracy of the aligned position determination. The parameter "mcc" is the multiple correlation coefficient indicating how well the measured signal resembles the signal expected for a perfect alignment mark; the "minirepro" is the standard deviation of the aligned position of different sections or portions of an alignment measurement, indicating the accuracy of the aligned position; the "signal to noise ratio" is the fitted signal divided by the relative level of noise across the spectrum of the measured signal, while the "signal shape" is the relative level of a few discrete frequencies in this spectrum, generally at multiples of the base frequency; the "signal envelope" is variance of the signal strength during the measurement; the "focus" is the offset in wafer height with respect to the detector; the "tilt" is the angle between the wafer angle and the detector angle during the measurement; "order channels position offset" is the measured difference in aligned position of the various channels of one wavelength; the "wavelength channels position offset" is the measured difference in aligned position of the various wavelength channels; the "shift between segments" is the measured difference in aligned position of the various segments of a multi segmented alignment mark; and the "coarse-fine position deviation" is the difference between the position of the alignment marks in the fine phase with respect to their expected position based on alignment mark measurements in the coarse phase.

Figure 29:
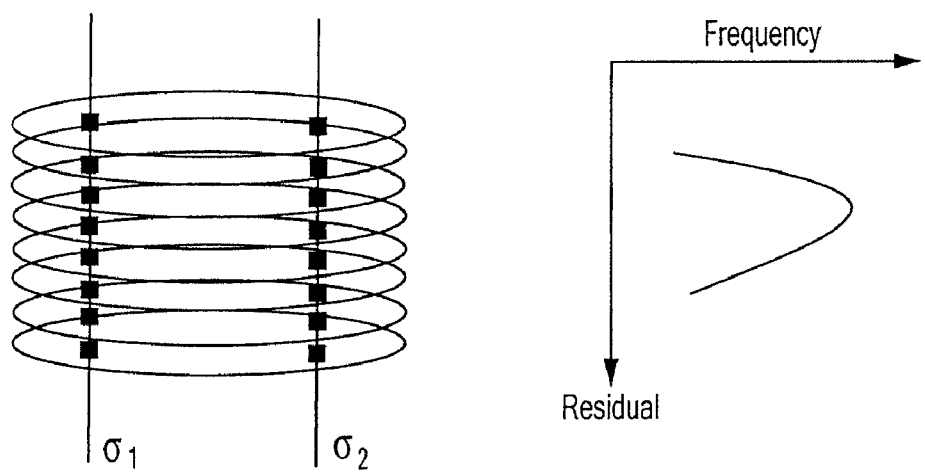
FIG. 29 illustrates processing quality control according to an embodiment of this invention.

The coefficients may also be determined by including the historical data of the process. For example, one can compare the information obtained for the diffraction order channels with the information from previous wafers. If the information of a certain channel differs significantly from the information for that channel on previous wafers, one could give that channel a lower weighted coefficient than when the information from that channel closely resembles the information from previous wafers. Another way of dealing with the information from the plurality of diffraction order channels, is to model the individual channels in terms of wafer grid parameters (translation, rotation, wafer expansion, orthogonality, asymmetric scaling and higher order parameters) for each of the channels. The residuals of the wafer model fit to the individual signals—the so-called grid residuals—are qualifiers for the relative importance of a certain diffraction channel. For example, if a residual for a channel on a certain position on the wafer closely resembles the historical residual distribution at that position, a larger weight factor is assigned than when the residual is way off the average residual on previous wafers. (Also see FIG. 29 for an illustration of a statistical distribution of wafer residuals $\sigma_1$, $\sigma_2$ . . . ) Historical data helps in that way to minimize the spread of the information obtained with the alignment system. One can also measure the information from a plurality of diffraction order channels and choose the channel(s) with the highest signal strength(s) for alignment and reject the information of diffraction order channels with lower signal strengths. Other measured quantities may also be used in such dynamic recipes.

Based on experimental data it is possible to determine the correlation between individual detectors. If the correlation is introduced by the process it can be utilized to generate weighting coefficients that are capable of providing a more accurate measurement. One embodiment utilizes a set of data and determines a static predictive recipe based on this information. A second embodiment verifies and adjusts a predictive recipe on the fly. Small adjustments are made to the predictive recipe if the correlation between the detectors measured on the current wafer are not identical to the predictive recipe.

In the examples of static recipes so far, the same information from the plurality of channels is used for all marks. Another type of static recipe can be distinguished that defines which information from the plurality of channels should be used for each target on the wafer. Such a static recipe enables the alignment system to deal with process variations across the surface. Instead of immediately selecting or weighting part of the information from the plurality of diffraction order channels for each mark, it can also be useful to collect all information from all targets first.

Then the wafer grids can be determined for all of the individual channels. Such a scenario offers much more flexibility. For instance, it is now possible to determine the wafer expansion on channels and/or marks that are different from the channels/marks that are used to determine the rotation.

Figure 20:
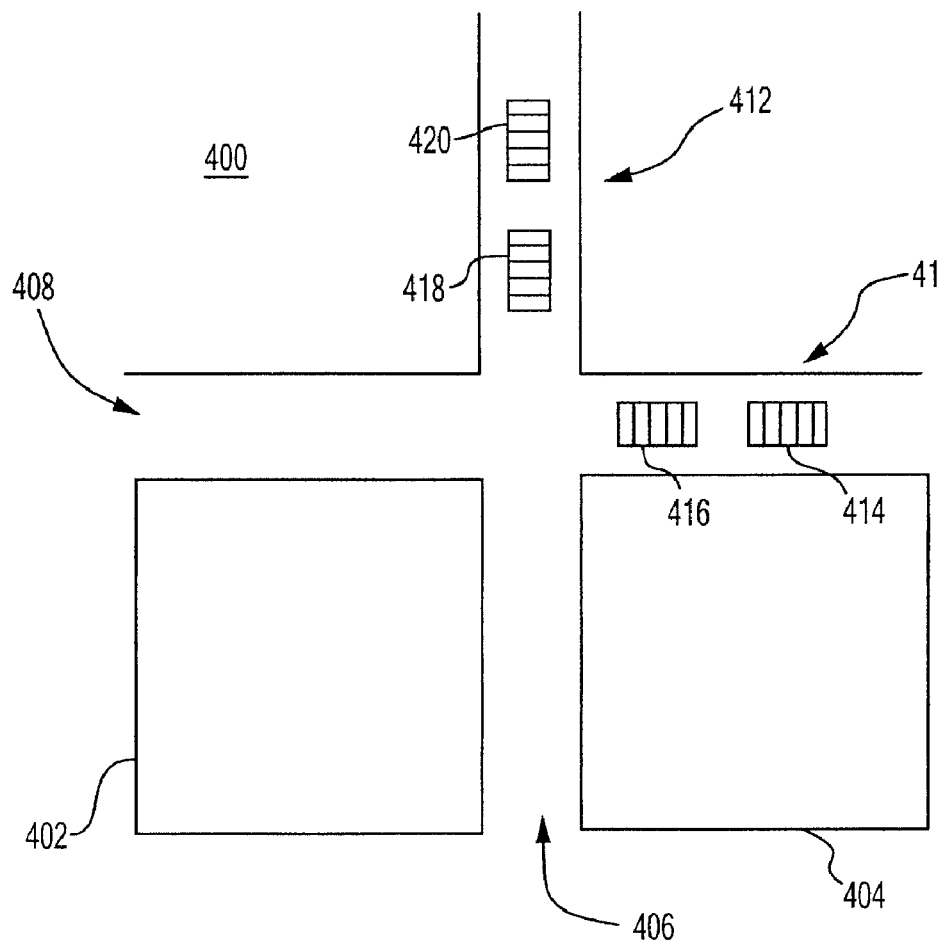
FIG. 20 is a schematic illustration of X and Y two-target alignment marks written in scribe lines of a semiconductor wafer.

The off-axial alignment system OAS may be used to detect various types of alignment marks. FIG. 2 illustrates an alignment mark which is often used as a fiducial mark on the wafer assembly or along the periphery of the wafer as a global alignment mark. FIG. 20 illustrates a portion of a semiconductor wafer 400 with a plurality of regions such as 402 and 404 where circuits will be, or are being, produced. Between the circuits are scribe lines, such as scribe lines 406 and 408. Alignment marks 410 are written in scribe line 408. Similarly, alignment marks 412 are written in scribe line 406. The alignment marks 410 and 412 are made to be sufficiently narrow in order to maintain narrow scribe lines to avoid waste of space on the wafer. The combination of alignment marks such as 410 and 412 provide alignment information in orthogonal directions, which will be referred to as X and Y directions. The alignment mark 410 is segmented such that it has a first target 414 and a second target 416. Similarly, alignment mark 412 is segmented such that it has a first target 418 and a second target 420. Each target 414, 416, 418, and 420 is a diffraction grating in this embodiment. In general, the gratings 414-420 can be either phase or amplitude gratings. For example, a phase grating may be formed by etching grooves in the substrate or a layer thereon. In this embodiment, each of the diffraction grating targets within a respect mark has a different periodicity, or pitch. Under current manufacturing processes and scales, it has been found to be suitable to use a pitch of 16.0 μm for one diffractive-grating target, such as target 416, and a 17.6 μm pitch for the second diffractive-grating target, such as target 414, and smaller. Such a combination is useful in the capture process that we will describe in more detail below.

The capture process is a form of coarse alignment in which the position of the alignment mark is established within a desired range. A fine alignment is performed to determine a more precise position of the subject alignment mark. During the alignment process, the wafer 400 will be moved so that a desired alignment mark is scanned across the detection field of view of the off-axial alignment system OAS in a direction substantially orthogonal to the grooves in the target gratings of the alignment mark. Note that all signals for capture and fine alignment can be obtained substantially in parallel. When the wafer 400 is moved so that the target grating 416 of the alignment mark 410 moves across the field of view of the alignment system OAS along the direction of the scribe line 408, an alignment beam having two wavelength components is reflected and diffracted from the target grating 416 (see also FIG. 12). With the embodiment of the alignment system OAS described above, signals in seven diffraction order channels and two color channels are detected as the target grating 416 scans across the field of view of the alignment system OAS (see the reference grating plate illustrated in FIG. 6). There is also an additional channel in each of the X and Y directions and for each of the two colors for the capture process.

Figure 21:
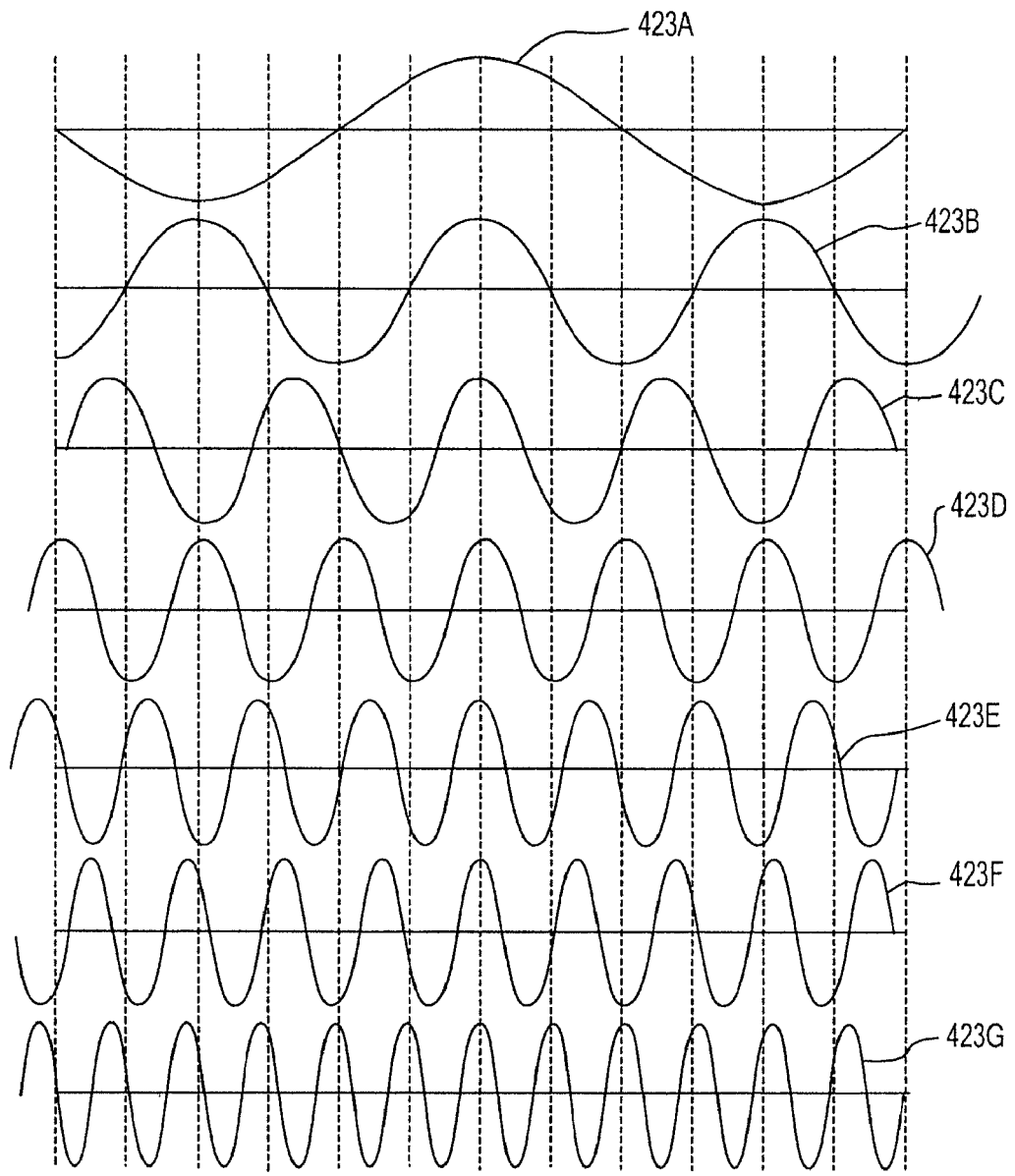
FIG. 21 illustrates output signals from seven diffractive order channels for one of two wavelengths in an off-axial alignment system according to an embodiment of this invention.

FIG. 21 illustrates an example of signals produced in the seven diffraction-order channels 423A-423G for one of the two wavelengths as a grating, such as the target grating 416, is scanned at a constant rate under the field of view of the off axial alignment system OAS. As the image of the target grating 416 comes into alignment with the reference grating for the respective diffractive order, there is a maximum in the signal strength. Conversely, when the image of the target grating 416 on its respective reference grating is completely out of alignment, there is a minimum in the detected signal strength. One can thus see that with a substantially constant scanning motion, the output signals are substantially sinusoidal. The signals for the higher order channels are at a higher frequency than the lower order channels. Signals are obtained in all seven of the diffractive order channels as a target grating 416 is scanned through the field of view of the off-axial alignment system OAS for each of the two colors of the alignment system. The alignment marks 410 and 412 provide one example of a multi-target alignment mark. In this embodiment, the targets are diffraction gratings. The plurality of targets within the segmented alignment mark 410 is used to determine a position of the alignment mark 410. Similarly, the targets within the segmented alignment mark 412 are used to determine a position of the alignment mark 412. The concept of a multi-segmented alignment mark may be extended to include three, four or more segments within an alignment mark. In addition to alignment marks with two segments, as illustrated in FIG. 20, the instant inventors have found alignment marks that have four targets within the mark to be currently useful. FIG. 22 illustrates an embodiment of such a four target alignment mark 422 which has targets 424, 426, 428 and 430. In this embodiment, the targets 424, 426, 428 and 430 are each diffraction gratings and thus can also be referred to as target gratings. The target gratings 424, 426, 428 each have the same pitch, while the target grating 430 has a different pitch (not shown). Suitable pitches have been found to be 16.0 µm for the diffraction gratings 424, 426 and 428 and 17.6 µm for the diffraction grating 430 for current feature scales and some applications. In this embodiment, one may select each target 424, 426 and 428 to have a different detection characteristic. For example, one may select the targets 424 and 426 and 428 to be diffraction order-enhancing gratings which enhance different diffraction orders. (In the foregoing, this means that it enhances the "signals" of that diffraction order compared to that of a uniform diffraction grating.) For example, one may construct the alignment mark 422 such that the target 424 is a diffraction order-enhancing grating that enhances the third diffraction order. The target 426 may be selected to enhance the fifth diffraction order and the target 428 may be selected to enhance the seventh diffraction order.

FIGS. 23A-23D are schematic drawings of cross-sections of portions of phase gratings. FIG. 23A corresponds to an ordinary diffraction grating with equally spaced grooves of equal widths. FIG. 23B is a schematic illustration of an order-enhancing grating for the third order in which the grooves between adjacent plateau regions in the ordinary grating of FIG. 23A are now subdivided into two portions. The width of this substructure region is maintained substantially the same as the regions 432, 434, and 436 illustrated in FIG. 23A. FIG. 23C illustrates an example of an order-enhancing grating for the fifth order in which the substructure has three portions instead of the two portions of FIG. 23B. FIG. 23D illustrates an order-enhancing grating which enhances the seventh order. In the case of the 16.0 µm grating, each of the sub-segments 432, 434, 436 and the trough regions 438, 440, etc. are 16.0 µm. The corresponding features in FIGS. 23B, 23C and 23D, are also 16.0 µm, but some have substructures.

An order enhancing grating is defined as a grating with a signal strength, in a diffraction order detection channel of the alignment sensor, which is enhanced with respect to the signal strength detected for a base pitch grating. FIG. 23A is an example showing a base pitch grating with a pitch of 16.0 µm. FIGS. 23B, 23C and 23D are examples of order enhancing gratings. A grating with a base pitch reduced by a factor N is another example of an order enhancing grating. The first order diffracted beam of such a grating will be detected by the N-th diffraction order detection channel of the alignment sensor. This results because a detector that we refer to as an nth-order detector detects light coming from an angle that would coincide with the nth order from a base pitch. Increasing or decreasing the pitch of the grating changes the angles at which the light from the grating diverges, thereby potentially changing which order from the grating is actually detected by the nth order detector. The scope of this invention is not limited to the above stated grating designs. All other gratings that enhance a diffraction order are within the scope of this invention.

When the reference mark 422 is scanned across the field of view of the off-axial alignment system OAS along its long dimension, the sensor produces signals in seven diffractive-order channels for each of the two illumination wavelengths. Consequently, a single scan across the alignment mark 422 can provide fourteen color/order signals for each of the targets 424, 426, 428 and 430. For an ordinary diffraction grating, the signal strength for the diffraction orders decreases with increasing diffraction order. The order-enhancing gratings enhance a particular diffraction order over what would normally be obtained with a diffraction grating with a purely constant pitch without any substructure. By selecting targets within the multi-target alignment mark 422 to be particular order enhancing gratings, one may then choose to utilize data of the enhanced order from the corresponding target. For example, when one selects target grating 424 to be a seventh order enhancing grating, target 426 to be a fifth order enhancing grating, and target 428 to be a third order enhancing grating, the inventors have obtained good results utilizing only the signals from the seventh order channels from the target 424, only the fifth order channels from the target 426, and only the third order channels from the target 428. The data illustrated in FIGS. 16-19 were obtained with such an alignment mark and processed in that manner Although the data presented in FIGS. 16-19 were obtained from signals in diffractive order channels corresponding to an order enhancing target grating of the same order in such a multi-target alignment mark, the general concepts described in reference to FIGS. 15-18 are not limited to only that case.

The alignment marks 410 and 412 in FIG. 20 provide an example of a multi-target alignment mark that has two targets that are diffraction gratings with different pitches. The four-target alignment mark 422 was described in terms of combining targets with both different pitches and targets selected to enhance particular diffraction orders. One may select targets to achieve additional or different effects. For example, one may include a target among multi-target alignment marks that have structural features that behave under processing in a predictable manner or in a manner correlated with changes in the devices being manufactured. For example, diffraction grating patterns may be provided with a sub-pattern to provide it with desired characteristics under manufacture. FIG.

Figure 24:
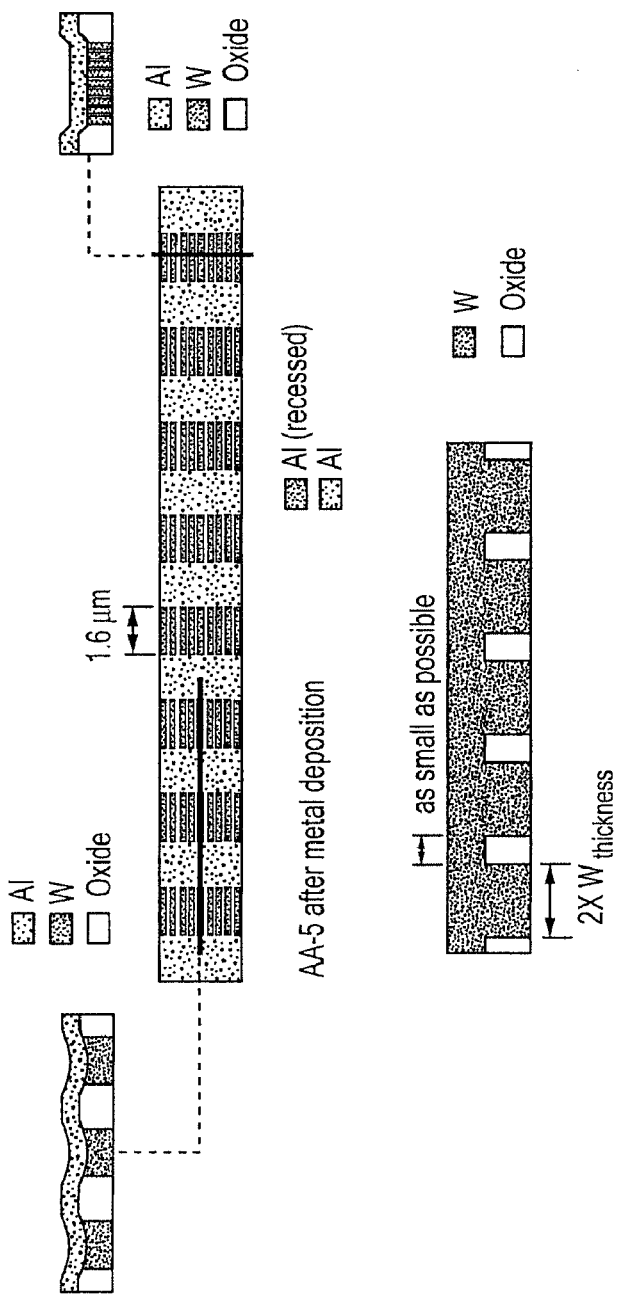
FIG. 24 is a perspective view illustrating a substructure of an alignment grating that has a processing structure.

24 illustrates an example in which a sub-pattern is added to a portion of a diffraction grating. (See also FIG. 26C.) For example, the sub-structure 432 in FIG. 23A may be cut across to obtain a structure 442 illustrated schematically in FIG. 26C. One may choose the widths of the structures in the component 442 so that they more closely resemble the feature structures in a device that is being manufactured. The sub-structure illustrated in FIG. 24 is believed to be useful for the W-CMP process. As one can see in the right hand cross-sectional view of FIG. 23, tungsten is used to fill the substructure grooves. One may also intentionally create a sacrificial target among the plurality of targets which undergo significant changes and possibly are destroyed during manufacturing processes.

A goal of the sacrificial target(s) is to determine process dependencies to improve the determination of the alignment mark position using the non-sacrificial target(s). Therefore the sacrificial target(s) are sensitive to process influences. For example, a first target of a multi-target alignment mark is optimized for position stability, while a second target of this multi target alignment mark is very sensitive to, for example, mark depth, line width or line angle. The sensitivity can be used to correct the process influence on the first target, resulting in a more stable position. While the position of the first target is relatively stable regardless of the process, the second target is optimized to detect with a proper detector the process effects and with this knowledge a better position of the alignment mark is calculated based on the combined information of both targets. An example of a target useful for position stability is a target with a section immediately above another section of the target. For example, the sections may be in different layers of a substrate. The different sections of the target may be gratings with different pitches in one exemplary embodiment. Since the target sections are at a nearly identical position relative to the plane of the substrate, signals from both target sections can be measured simultaneously. The signals from the different sections of the targets are thus not sensitive to errors in the motion of the substrate or the substrate holder.

The goal of a sacrificial target in another embodiment is to prepare or finish an alignment target positioned either above or below the sacrificial target. An example of a sacrificial target placed on top of another target is a structure which removes opaque material from the wafer surface. This enables light to penetrate the substrate and reach an underlying target, enabling alignment on a target which would otherwise not have been possible. An example of a sacrificial target placed beneath another target is an opaque structure. The effective depth of an alignment grating located in a transparent material can be tuned by placing an opaque structure underneath the grating. The scope of this embodiment is not limited to the examples provided. Other structures placed above or below an alignment target to improve the alignment performance are within the scope of this embodiment.

In another embodiment a first target closely resembles the product structure and thus suffers substantially the same distortion and process effects as the actual product. The target can be built up out of substructures comprising features like contact holes or lines with a resolution more closely resembling the features in the product. Such a target represents the position of the product better, but can also be affected more by the process, making the target hard to detect. For example the CMP process is known to completely remove surface structures at product resolution. A benefit of the multi target alignment mark is that a robust second target is essentially always available for backup purposes.

In another embodiment the overlay is determined using a multi target alignment mark by printing target(s) or part of target(s) in different layers. An example is given using the Moiré technique where in layer 1 pattern a is printed and in layer 2 pattern b is printed overlapping pattern a, both forming a first target of a multi target alignment mark. Using a specific pattern a and pattern b, this generates a beat pattern that can be detected by the alignment sensor and the position shift of the first target with respect to a second target indicates the overlay. Benefits of the multi target mark in this matter are that the alignment targets are placed at substantially the same position on the wafer. Possible measurement errors due to process variations within a die will not occur.

The sacrificial target can also be used for other purposes than position determination, for example focus, energy, dose, line width, contact hole width or critical dimension measurements and can be used in single-target marks or multi-target marks. In this embodiment the sacrificial target is especially sensitive to these effects making them detectable with an alignment or overlay sensor. Product line width, contact hole width or critical dimension generally can be measured using the relative signal strength of the alignment target when this target consists of groups of contact holes or lines with resolution and density similar to the product. An example of an alignment target that is sensitive to focus and dose is shown in WO 02/052350 A1, which is hereby incorporated by reference in its entirety. See also, EP-02253 1766, the entire content of which is hereby incorporated by reference. For these measurements, some edge dies with no yield prospect are printed with a focus offset or dose offset and the focus or dose is detected with an alignment or overlay sensor and adjusted in a feedback loop.

Using three detector channels, it becomes possible to do an online qualification and calibration of the measurement systems. For example, three detector channels measure the position of a multi target alignment mark. With two detector channels agreeing on the measured position and the third sensor measuring a different position this third sensor can be qualified as unreliable when measuring this alignment mark. In another example two detector channels always measure a constant position difference in the aligned position, regardless of the process or alignment mark. This offset can be corrected by automatic calibration or matching. In another example two detector channels have a specific offset in position measurement for alignment marks on a particular process, this offset can be calibrated for said particular process. The calibrated offset can be used to correct the measured value when switching from one sensor to another or when both detector channels are used at the same time.

As noted above, the concept of multi-target alignment marks is not limited to the use of only multi-grating alignment marks. The targets within the multi-target alignment mark may be targets of various types. It may include gratings as targets as well as other targets which are detected by other processes, such as edge detection and/or image recognition techniques. In addition, some targets within a multi-target alignment mark may be optimized for one particular type of sensor, such as gratings are optimized for the off axial alignment system OAS described above, but other targets within the same mark may be suitable for other alignment systems and/or other measurement systems. For example, a target within a multi-target alignment mark may be suitable for detection by an online metrology tool that is used to assess the accuracy of exposure of a photo-resist before further processing.

Figure 25:
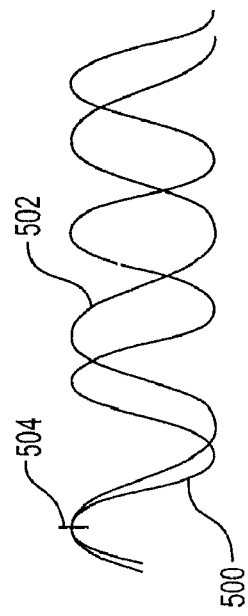
FIG. 25 is a schematic illustration for explaining the concept of an alignment capture system and method according to an embodiment of the invention.

The capture process may also be improved by the use of new multi-target alignment marks. Under the current capture process, the alignment sensor is scanned across a diffraction grating that has a first pitch. As noted above, the scanning is typically accomplished by moving the substrate through the field of view of the alignment sensor. This results in a sinusoidal signal 500 of a first period, as is illustrated schematically in FIG. 25. The alignment sensor is then scanned across a diffraction grating that has a second pitch that is greater than the first pitch, in this example, in which the first and second gratings are part of the same multi-target alignment mark, i.e., a single position will be determined for the alignment mark using the two targets in conjunction. A second sinusoidal signal 502 is generated from the second grating that has a different period than that of the first signal. Consequently, a point of coincidence of the maxima of the two signals 504 will come into coincidence again after a desired number of cycles for appropriately selected pitches. For current applications, a first grating with a pitch of 16.0 µm and a second grating with a pitch of 17.6 µm have been found to be useful. In this case, the signals come into coincidence again after 11 cycles of the 16.0 µm grating and 10 cycles of the 17.6 µm grating. This pattern repeats periodically, thus leading to ambiguity in the correct alignment position (i.e., one may capture one of the repeating coinciding points. The capture range is ±44 µm in this case in which errors of multiples of 88 µm are introduced when the wrong ambiguous ranges are chosen.

The capture process can also be performed using diffraction order sub-beams detected with either of the axial or off-axial alignment systems described above. Furthermore, higher than first order sub-beams may be used for the capture process and/or diffraction order enhancing gratings may be used. In addition, a variety of types of targets may be used.

Figure 26A:
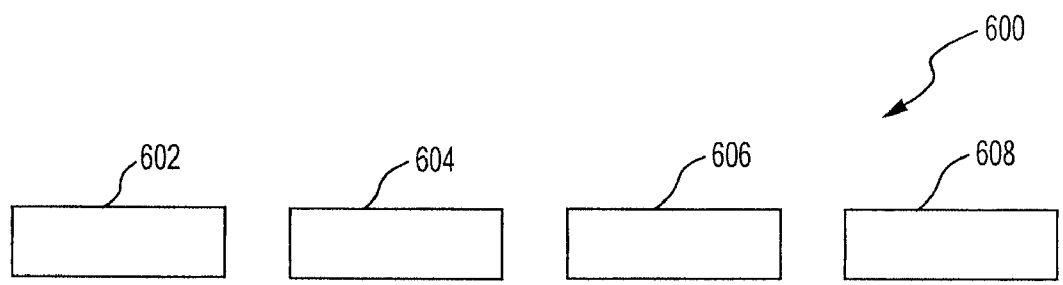
FIGS. 26A, 26B and 26C are schematic illustrations of multi-target alignment marks that have process specific targets according to an embodiment of this invention.
Figure 26B:
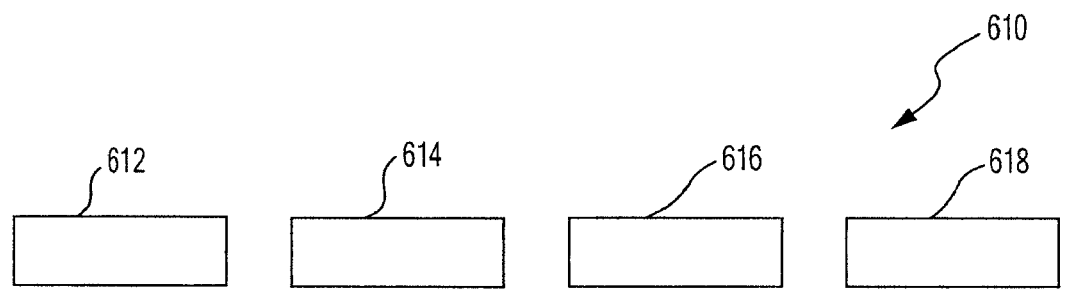
Figure 26C:
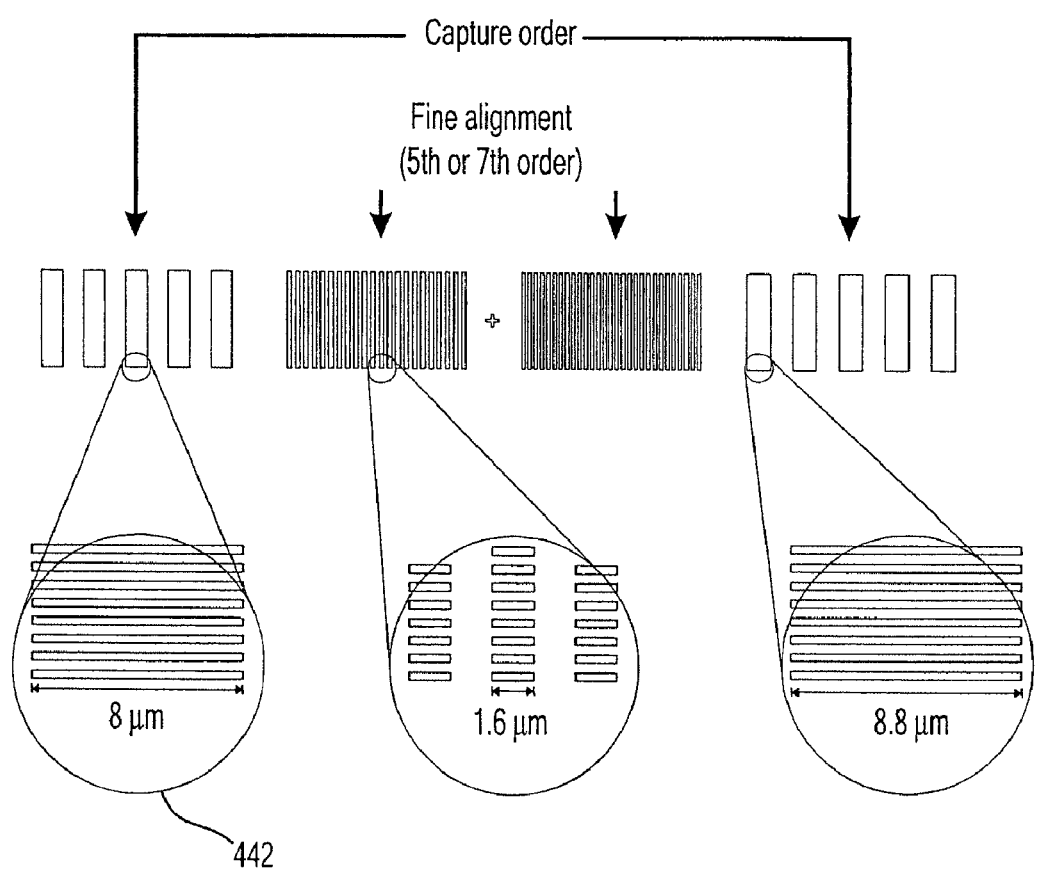

Other target types may also be included in a multi-target mark for performing capture of the alignment mark. For example, one may include multiple grating pairs in which each pair has a different sub-segmentation, e.g., diffraction-order-enhanced gratings, or different process segmentations, e.g., as discussed previously with reference to FIG. 24. FIGS. 26A and 26B illustrate two examples of multiple pairs of gratings. The alignment mark 600 has four targets 602, 604, 606 and 608. The targets 602, 604 and 606 may be, for example, order enhancing gratings that enhance the third, fifth and seventh orders, respectively, and may have a pitch of 16.0 µm. (Note that the gratings that have a pitch of 16.0 µm are also referred to as 8.0 µm gratings because each line or groove, ignoring any substructure, is one-half the pitch.) The target 608 may be an order-enhancing grating that enhances the third order, for example, and has a pitch of 17.6 µm. Another example is the alignment mark 610 that has four order-enhancing gratings, all of which enhance the fifth order. The targets 612, 614 and 616 each have a pitch of 16.0 µm, while the target 618 has a pitch of 17.6 µm. In this example, the targets 614 and 616 may each have a different process segmentation. These are only a couple of specific examples of the large number of possible variations. Which pair of gratings is used for alignment can be pre-defined and/or can be dynamically determined based on the quality of the measured signals. A typical qualifier for a pair of 16.0 and 17.6 µm signals is the remaining shift between two signal maxima of the closest 16.0 and 17.6 µm maxima, zero remaining shift being the best. In addition, multi-target marks can be used in identifying particular detected marks that are far from the mean value. If one uses three or more gratings, such as 16.0 µm gratings, or even arbitrary targets, one can compare the aligned positions of the gratings with each other and can detect if one of the results is far from the other two or more. This deviating alignment signal is called the "flyer" and will thus not be used for determining the position of the wafer. Flyers can be determined on a mark-to-mark basis as a whole, or further specified with respect to a particular detection channel. In addition, one can determine the position on a target-to-target basis and targets as a whole are evaluated as to their position compared to the other targets of the mark and then one can decide whether to keep the target for the aligned position determination, or whether to reject the target. This mechanism has been found to be especially useful during capture since the selection of the wrong maximum of a higher order (high frequency) after the capture process can be readily detected since the error will be at least 8 µm (for 7th order) in a current example.

One of the multigrating embodiments is a capture multi-grating mark. This mark has two gratings optimized for capturing and two grating optimized for fine alignment. A major benefit of this embodiment is that a compromise is not required to enable both capturing and fine alignment with a single grating. Another embodiment is the process multigrating. (See, FIG. 26C.) This mark has one 17.6 µm pitch segment for capturing and three 16 µm pitch segments. The 16 µm pitch segments are equipped with features enhancing the same diffraction order. The features of each 16 µm pitch segment is optimized for a specific process window. Depending on the process characteristics one of the 16 micron pitch segments will be used for alignment.

Figure 27:
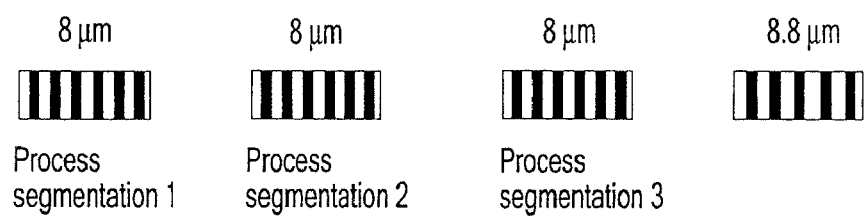
FIG. 27 is a schematic illustration of a multi-target alignment mark according to another embodiment of this invention.

Another embodiment of this invention is a system for an improved overlay strategy. The parameters for wafer alignment are important for an overlay strategy in building up a micro-device. Some of the important parameters are the number of alignment marks used, the alignment recipe, residual thresholds, and location of the marks on the wafer. FIG. 27 illustrates a multi-target mark according to an embodiment of this invention that may be used with a system that has improved overlay. The numerical values of corresponding to the grating pitches (one-half the pitch values) are provided as an example of values that are currently found to be useful and are not a limiting feature of the general concept. The alignment mark illustrated in FIG. 27 has three process targets that provide robust alignment on such marks over most processes currently used in a fabrication plant ("fab") (i.e., CMP, PVD, STI, DT, Cu-Damascene, etc). Three process targets have been found to be useful, but one could use other numbers of process targets without departing from the scope of this invention. To enhance the robustness against processing for a specific process, special process modules have been designed. Examples of process targets are described above with reference to FIGS. 24 and 26C. For example, in cases where the W thickness varies significantly during deposition, the process segmentations are chosen in such a way that the full range of W-thickness variation is covered. In that way, optimal alignment performance after the W-CMP & AL-PVD process steps is obtained.

Figure 28:
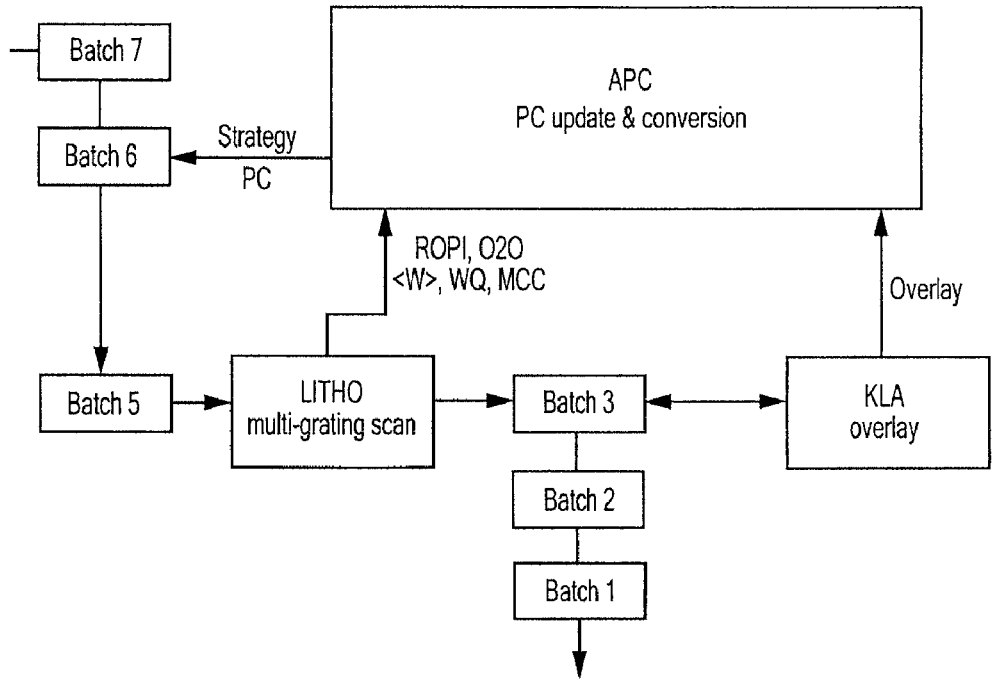
FIG. 28 illustrates a semiconductor processing system according to an embodiment of this invention.

One or more targets within a multi-target alignment mark are used for active alignment while other targets are measured in parallel to provide additional information such as the Signal Quality (MCC) which is a correlation coefficient for the fit of the signal to an expected functional form, signal strength (SS) and grid modeling parameters (Translation, Rotation, Magnification, etc). FIG. 28 is a schematic illustration the data flow in a fab-wide automatic process control (APC) system according to this invention. Since the APC system also receives data from off-line overlay metrology tools, the system can predict overlays that could have been obtained with alternative strategies. The APC system can be configured according to this embodiment of the invention to determine if and when a switch to a different strategy will be made. Note that information can also be provided to a person to make a decision as to whether a change to a different strategy will be made.

The embodiment described immediately above is for a feedback loop in an external control system. This is useful for slowly varying parameters such as on a batch-to-batch basis. Another embodiment of this invention provides a "fallback" system and method, and dynamic global alignment strategies on wafer-to-wafer basis. This lithography-tool-based control loop is an embodiment of Automated Equipment Control (AEC). In this invention, an automatic fallback is to one of the alternative strategies in case the active alignment strategy fails. For instance, a predefined fallback strategy or a strategy that performs second best can be used for fallback. In that way, the number of wafers that is rejected during the manufacturing process due to alignment errors can be minimized.

In case of alignment failure, it is clear that a switch to another strategy should take place. However, in cases of dynamic global alignment strategies within a batch, switching to an alternative strategy is based on indirect indicators of overlay performance, since no external overlay data is available. Such indicators are for instance the order-to-order stability, residual analysis or signal quality analysis (SS, MCC). See, "Extended Athena alignment performance and application for the 100 nm technology node" by Ramon Navarro, Stefan Keij, Arie den Boef, Sicco Schets, Frank van Bilsen, Geert Simons, Ron Schuurhuis, Jaap Burghoorn. 26th annual international symposium on microlithography, Feb. 25-Mar. 2, 2001 in Santa Clara, Calif., the entire content of which is hereby incorporated by reference. Order-to-order (O2O) stability is a measure for the variation on the aligned position as induced by processing only. Residual analysis characterizes how well the modeled wafer grid fits into the measured positions e.g., the Residual Overlay Performance Indicator (ROPI). The decision to switch to an alternative strategy can be implemented within a batch. However, when switching to an alternative strategy, usually new process corrections are required. In both cases (fallback and dynamic global alignment strategies), the determination of the correct process corrections is a problem. Since the process corrections are assumed to be stable over batches, those can be derived in the slow feedback APC system. Thus, the APC system does not determine the parameters of the new alignment strategy here, but determines the process corrections for all segments of the multi-target mark and sends those corrections to the lithography tool (LITHO). With these data on the lithography tool, a feedback loop can be implemented with switching of alignment strategy on a batch-to-batch basis.

In another embodiment of this invention, data collected from the alignment systems can be used to improve quality control during manufacture. Quality control WQ is performed on an overlay metrology tool on a few wafers that are usually randomly picked from each batch. Therefore, it is very well possible that non-representative wafers are chosen from a batch. Since the process corrections for the next batch are based on these overlay metrology measurements, this may result in overlay variations from batch-to-batch. In this embodiment, alignment data—that is available for every wafer—is used to identify the wafers to be measured on the overlay metrology tool. To determine which wafers are representative for a batch, one can for instance determine the wafer-to-wafer distribution of the wafer model parameters (translation, expansion, rotation)<W> and identify the wafers that are closest to the batch averaged wafer parameters. In particular, the wafer expansion and non-orthogonality are useful for this purpose. Alternatively, one can look at the grid residuals, i.e., the deviation of each measured position from a best grid fit to the measured positions. If the alignment marks have been exposed on a different machine, a systematic error can occur with the grid residuals. The alignment system will then measure each mark with a different offset. This offset gives a large contribution to the residuals, thereby obscuring true processing effects. By determining the residual distribution per mark location as shown in FIG. 27, the effect of the offset is excluded. Now it can be determined for all marks individually if they fit into the grid. Other qualifiers that can be used are the SS and MCC distribution across all marks and all wafers, or per mark across all wafers. Alternatively, one could also indicate the worst wafer and suspect wafer (flyer). For instance, the worst SS, MCC, or residual may be used. If these worst wafers are within specification on the overlay metrology tool (KLA), the entire batch is also within specification.

In another embodiment of the invention, the alignment data is used to determine the process corrections for the alternative strategies. The process corrections are determined on the overlay metrology tool for the active strategy only. The difference between the active and alternative strategy is measured by the alignment system. The formula to calculate process corrections for a new strategy from the process corrections of an old strategy and alignment data is as follows:

$$PC_{new} = <W^{new} - W^{old}> PC^{old}. \qquad (13)$$

This applies for each wafer model parameter, where PC is offline modeled wafer model parameters and W is the exposed wafer grid parameters. The applicable wafer parameters are: translation X,Y; wafer expansion X,Y; wafer rotation, non-orthogonality. Different scenario's are available for the averaging of alignment data, for example:

1. all wafers from the batch;
2. only the wafers used for offline overlay measurement;
3. previous batches (in case of rejects).

In another embodiment of this invention, instead of correcting the modeled overlay metrology data (PC), the raw overlay metrology data are given an offset according to the grid difference $W^{alternative} - W^{active}$ for each overlay target and each wafer measured offline. Now the overlay performance and process corrections for that alternative strategy are calculated for the batch. The operator or APC system can now monitor the trends in overlay (i.e., as a function of time for several batches) so that the operator or APC system determines whether to switch to one of the alternative strategies.

Since the numerous systems described above use coherent alignment radiation sources, the phase modulation techniques described in U.S. Pat. No. 6,384,899 may also be used in combination with the systems described herein. The entire content of the U.S. Pat. No. 6,384,899 is hereby incorporated herein by reference in its entirety. The alignment system according to the current invention may be implemented in a variety of alignment apparatuses. In a specific example, it may be implemented in the alignment system illustrated in FIGS. 3, 5, 7, 12 and 13. In this example, the alignment system has a position determining unit. In general, the position determining unit may be either a hardwired special purpose component or may be a programmable component. In a programmable unit, the position determining unit comprises a CPU, memory and data storage area. In addition, the position determining unit will have I/O ports for communicating with other equipment and/or interfacing with users.

The invention is described with reference to exemplary embodiments. It is not limited to only those embodiments and includes combinations and variations of those embodiments within the scope of the invention as defined by the appended claims. The invention is also described with reference to its use in apparatuses for step-and-scan imaging of a mask pattern on a substrate for manufacturing ICs, but this does not mean that it is limited thereto. The invention may be alternatively used in such an apparatus for manufacturing integrated, or plenary, optical systems, guidance and detection patterns for magnetic domain memories, or liquid crystalline display panels. The projection apparatus may not only be an optical apparatus, in which the projection beam is a beam of electromagnetic radiation and the projection system is an optical projection lens system, but also an apparatus in which the projection beam is a charged-particle beam such as an electron beam, an ion beam or an X-ray beam, in which an associated projection system, for example an electron lens system is used. Generally, the invention may be used in imaging systems with which images having very small details must be formed. Of course, various combinations of the above are also within the scope of this invention.

We claim:

1. An alignment method in a lithographic apparatus, the method comprising:
    illuminating an alignment mark provided on a substrate with a radiation beam, the alignment mark including a first grating and a second grating that are each adapted to enhance a different diffraction order, each of the first and the second grating including a plurality of segments alternately repeated along a first direction, wherein at least one segment of each of the first and the second grating is divided to form sub-segments that are alternately repeated along a second direction that is different from the first direction;
    detecting a signal resulting from an interaction between the alignment mark and the radiation beam; and
    aligning the substrate in the lithographic apparatus based on the detected signal.

2. The method of claim 1, wherein each segment of each of the first and the second grating is divided to form sub-segments that are alternately repeated along the second direction.

3. The method of claim 1, wherein the illuminating includes scanning the radiation beam over the first and the second grating.

4. The method of claim 1, wherein the alignment mark comprises a third grating that is adapted to enhance a diffraction order that is different from the diffraction orders enhanced by the first and the second grating, wherein the third grating includes a plurality of segments alternately repeated along the first direction, wherein at least one segment of the third grating is divided to form sub-segments that are alternately repeated along the second direction.

5. The method of claim 1, wherein the alignment mark is formed in a metal layer on the substrate and dimensions of the segments of the first and second gratings are selected based on a thickness variation of said metal layer on said substrate.

6. The method of claim 4, comprising determining an alignment signal for each of the first, second and third gratings and comparing the alignment signal of the first grating with the alignment signals of the second and third gratings.

7. The method of claim 5, wherein the metal is tungsten or aluminum.

8. A device manufacturing method comprising:
    projecting a patterned beam of radiation onto a substrate; and
    aligning the substrate so that the patterned beam of radiation is projected at desired locations on the substrate, the aligning comprising
        illuminating an alignment mark provided on the substrate with a radiation beam, the alignment mark including a first grating and a second grating that are each adapted to enhance a different diffraction order, each of the first and the second grating including a plurality of segments alternately repeated along a first direction, wherein at least one segment of each of the first and the second grating is divided to form sub-segments that are alternately repeated along a second direction that is different from the first direction; and
        detecting a signal resulting from an interaction between the alignment mark and the radiation beam.

9. The method of claim 8, wherein each segment of each of the first and the second grating is divided to form sub-segments that are alternately repeated along the second direction.

10. The method of claim 8, wherein the illuminating includes scanning the radiation beam over the first and the second grating.

11. The method of claim 8, wherein the alignment mark comprises a third grating that is adapted to enhance a diffraction order that is different from the diffraction orders enhanced by the first and the second grating, wherein the third grating includes a plurality of segments alternately repeated along the first direction, wherein at least one segment of the third grating is divided to form sub-segments that are alternately repeated along the second direction.

12. The method of claim 8, wherein the alignment mark is formed in a metal layer on the substrate and dimensions of the segments of the first and second gratings are selected based on a thickness variation of said metal layer on said substrate.

13. The method of claim 11, comprising determining an alignment signal for each of the first, second and third gratings and comparing the alignment signal of the first grating with the alignment signals of the second and third gratings.

14. The method of claim 12, wherein the metal is tungsten or aluminum.

15. A lithographic apparatus comprising:
    a patterning device support configured to support a patterning device, the patterning device adapted to pattern a beam of radiation to form a patterned beam of radiation;
    a substrate table configured to support a substrate;
    a projection system configured to project the patterned beam of radiation onto the substrate; and
    an alignment system configured to align the substrate in the lithographic apparatus, the alignment system comprising
        a source of radiation configured to illuminate an alignment mark provided on the substrate with a radiation beam, the alignment mark including a first grating and a second grating that are each adapted to enhance a different diffraction order, each of the first and the second grating including a plurality of segments alternately repeated along a first direction, wherein at least one segment of each of the first and the second grating is divided to form sub-segments that are alternately repeated along a second direction that is different from the first direction, and
        a first and a second detection channel, the first detection channel adapted to detect a signal resulting from an interaction between the first grating and the radiation beam and the second detection channel adapted to detect a signal resulting from an interaction between the second grating and the radiation beam.

16. The apparatus of claim 15, wherein each segment of each of the first and the second grating is divided to form sub-segments that are alternately repeated along the second direction.

17. The apparatus of claim 15, wherein the alignment system comprises a third detection channel adapted to detect a signal resulting from an interaction between a third grating formed in the alignment mark and the radiation beam, the third grating adapted to enhance a diffraction order that is different from the diffraction orders enhanced by the first and the second grating, wherein the third grating includes a plurality of segments alternately repeated along the first direction, wherein at least one segment of the third grating is divided to form sub-segments that are alternately repeated along the second direction.

18. The apparatus of claim 17, wherein the alignment system is adapted to determine an alignment signal for each of the first, second and third gratings and to compare the alignment signal of the first grating with the alignment signals of the second and third gratings to align the substrate.

* * * * *